United States Patent
Fujino et al.

(10) Patent No.: US 9,270,195 B2
(45) Date of Patent: Feb. 23, 2016

(54) POWER CONVERTER INCLUDING A POWER MODULE ALLOWING MAIN CURRENT SUPPLY AND CUTOFF

(75) Inventors: Shinichi Fujino, Mito (JP); Yusuke Takagi, Hitachinaka (JP); Takuma Hakuto, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 693 days.

(21) Appl. No.: 13/580,272

(22) PCT Filed: Aug. 19, 2010

(86) PCT No.: PCT/JP2010/064009
§ 371 (c)(1),
(2), (4) Date: Aug. 21, 2012

(87) PCT Pub. No.: WO2011/118057
PCT Pub. Date: Sep. 29, 2011

(65) Prior Publication Data
US 2012/0320645 A1    Dec. 20, 2012

(30) Foreign Application Priority Data

Mar. 23, 2010    (JP) .................................. 2010-066272

(51) Int. Cl.
*H02M 7/00*    (2006.01)
*H02M 3/00*    (2006.01)
*H03K 17/691*    (2006.01)

(52) U.S. Cl.
CPC ..... *H02M 7/003* (2013.01); *H01L 2224/49111* (2013.01); *H01L 2924/1305* (2013.01); *H01L 2924/13055* (2013.01); *H02M 3/00* (2013.01); *H03K 17/691* (2013.01)

(58) Field of Classification Search
CPC ................................ H02M 3/00; H02M 7/003
USPC ......................................... 363/144, 146, 147
See application file for complete search history.

(56) References Cited

U.S. PATENT DOCUMENTS

| 7,109,577 B2* | 9/2006 | Shiraishi | H01L 23/495 257/666 |
| 2009/0040724 A1* | 2/2009 | Nishikimi | H02M 7/003 361/699 |
| 2010/0025126 A1* | 2/2010 | Nakatsu | B60L 11/00 180/65.1 |
| 2010/0052449 A1* | 3/2010 | Hashimoto | B62D 5/0406 310/91 |

FOREIGN PATENT DOCUMENTS

| JP | 2007-82359 A | 3/2007 |
| JP | 2009-44891 A | 2/2009 |
| JP | 2010-35347 A | 2/2010 |
| JP | 2010-63242 A | 3/2010 |

OTHER PUBLICATIONS

Corresponding International Search Report with English Translation dated Nov. 16, 2010 ( five (5) pages).

* cited by examiner

*Primary Examiner* — Jue Zhang
*Assistant Examiner* — Lakaisha Jackson
(74) *Attorney, Agent, or Firm* — Crowell & Moring LLP

(57) ABSTRACT

A power converter includes a power module allowing supply and cutoff of main current, a driver module controlling supply and cutoff of the main current, a high potential side semiconductor device, and a low potential side semiconductor device. Plural power module side wirings are connected with respective electrodes contained in the high and low potential side semiconductor devices. Plural driver module side wirings are provided on the driver module as wirings connected with the plural corresponding power module side wirings. Conductors are disposed in the vicinity of a plane on which the plural power module side wirings are provided and a plane on which the plural driver module side wirings are provided, and electrically connected to surround magnetic flux generated by current looping at least through a power source transformer, the driver module side wirings, and the power module side wirings.

12 Claims, 20 Drawing Sheets

POWER CONVERTER INCLUDING A POWER MODULE ALLOWING MAIN CURRENT SUPPLY AND CUTOFF

TECHNICAL FIELD

The present invention relates to a power converter, and more particularly to a power converter for a hybrid system of an automobile.

BACKGROUND ART

A power converter for a hybrid system of an automobile controls motor current by switching of a power semiconductor device. With increase in the output from the hybrid system in recent years, motor current and voltage of the system are increasing. Therefore, the problem of surge voltage generated at the time of switching of the power semiconductor device has been an issue to overcome.

Conventionally, surge voltage generated by switching is decreased by reduction of main circuit inductances of the power semiconductor device and a capacitor achieved by shortening the wiring lengths of the power semiconductor device and the capacitor and laminating the wirings thereof, and laminating the wirings inside the capacitor, or by other methods (for example, see PTL 1). The reduction of surge voltage allows high-speed switching and thus achieves reduction of losses, so that the fuel cost of the vehicle can improve.

CITATION LIST

Patent Literature

PTL 1: JP-A-2009-44891

SUMMARY

Technical Problem

It is expected that the reduction of the main circuit inductance discussed above is effective for reduction of surge voltage. However, high-speed switching changes current flowing in the power semiconductor device more rapidly, and thus raises surge voltage. More specifically, the switching speed increases by reduction of surge voltage when the withstand voltage of the power semiconductor device is uniform. However, with increase in the switching speed, the possibility of oscillation of gate current flowing at the time of connection and disconnection of the power semiconductor device rises. Moreover, gate current in the related art flows through a long wiring between the semiconductor device disposed on the lower side and a printed board disposed on the upper side. Therefore, the possibility of gate current oscillation further increases.

In addition, surge voltage generated by switching of the power semiconductor device affects the printed board electrically connected with the power semiconductor device, and a power source transformer generating power supply for gate current. More specifically, surge voltage attenuated by wiring or the like is superposed on power source transformer output voltage and wiring pattern voltage of the printed board. As a result of voltage fluctuations caused by the surge voltage, leakage current is generated by stray capacitance between wiring patterns on the printed board, and stray capacitance of the power source transformer. In this condition, noise is produced throughout the printed board.

The leakage current in the related art becomes a loop current which passes from the power semiconductor toward the printed board and returns to the power semiconductor when flowing in the longest path. Moreover, due to the large wiring length as noted above, the stray capacitance and the wiring inductance are high, while the noise resistance is low. Thus, the power semiconductor device may be accidentally turned on by the noise generated by the leakage current, in which case the power semiconductor device is broken in the worst case.

Solution to Problem

A first aspect of the invention is directed to a power converter which has a power module allowing supply and cutoff of main current, and a driver module controlling supply and cutoff of the main current allowed by the power module and includes: a high potential side semiconductor device which allows supply and cutoff of the main current on the high potential side of the power module; a low potential side semiconductor device which allows supply and cutoff of the main current on the low potential side of the power module, and is connected with the high potential side semiconductor device in series; plural power module side wirings connected with respective electrodes contained in the high potential side semiconductor device and the low potential side semiconductor device, and disposed adjacent to each other substantially on the same plane as the power module in the order of applied potentials with a connection end between the plural power module side wirings and the driver module located along the end of the power module; plural driver module side wirings provided on the driver module as wirings connected with the plural corresponding power module side wirings, and disposed adjacent to each other substantially on the same plane as the driver module in the order corresponding to the positions of the plural power module side wirings in positions along the end of the driver module; a power source transformer as a circuit provided on the driver module to convert a signal voltage for controlling the supply and cutoff of the main current into voltage applied to a control electrode of the high potential side semiconductor device and a control electrode of the low potential side semiconductor device, plural terminals of the power source transformer in correspondence with the plural driver module side wirings being provided in the order of the positions of the plural corresponding driver module side wirings; conductors disposed in the vicinity of the plane on which the plural power module side wirings are provided and in the vicinity of the plane on which the plural driver module side wirings are provided, and electrically connected in such positions as to surround magnetic flux generated by current looping at least through the power source transformer, the driver module side wirings, and the power module side wirings.

According to a second aspect of the invention, it is preferable that, in the power converter of the first aspect, the plural power module side wirings are disposed substantially on the same plane as the power module in such positions that current in one wiring of the power module side wirings flows in a direction opposed to the flow direction of current in another wiring of the power module side wirings disposed adjacent to the one wiring.

According to a third aspect of the invention, it is preferable that, in the power converter of the first or second aspect, an input terminal through which the main current is inputted to the power module and an output terminal through which the main current is outputted from the power module are disposed at the end of the power module on the side opposite to the side where the connection end between the power module and the driver module is positioned.

According to a forth aspect of the invention, it is preferable that, in the power converter of the third aspect, there are provided on the plane where the plural power module side wirings are disposed, a highest potential extracting wiring as a side of the highest potential wiring to which the highest potential is applied in the plural power module side wirings, disposed in an area on the side opposite to the side where the lowest potential wiring to which the lowest potential is applied in the plural power module side wirings is disposed, and electrically connected with the highest potential wiring, with a connection end between the highest voltage extracting wiring and the driver module disposed at the end of the power module on the side where the connection end between the plural power module side wirings and the driver module is positioned, and a lowest potential extracting wiring disposed adjacent to the highest potential extracting wiring in the area on the opposite side in such a position that current flows in a direction opposed to the highest potential extracting wiring, and electrically connected with the lowest potential wiring, with a connection end between the lowest potential extracting wiring and the driver module disposed at the end of the power module on the side where the connection end between the plural power module side wirings and the driver module is positioned. In this case, the plural driver module side wirings contain wirings connected with the highest potential extracting wiring and the lowest potential extracting wiring, and are disposed in correspondence with the highest potential extracting wiring and the lowest potential extracting wiring as well.

According to a fifth aspect of the invention, it is preferable that, in the power converter of any one of the first through fourth aspects, a high potential side gate wiring contained in the plural power module side wirings and connected with a gate electrode of the high potential side semiconductor device, and a high potential side emitter wiring connected with an emitter electrode of the high potential side semiconductor device and the corresponding wiring of the plural driver module side wirings are disposed adjacent to each other in such positions that flow directions of currents flowing in the high potential side gate wiring and the high potential side emitter wiring are opposed to each other.

According to a sixth aspect of the invention, it is preferable that, in the power converter of the fifth aspect, the emitter electrode of the high potential side semiconductor device is connected in parallel with a low potential side collector wiring connected with the high potential side emitter wiring and a collector electrode of the low potential side semiconductor device.

According to a seventh aspect of the invention, it is preferable that, in the power converter of any one of the first through sixth aspects, a low potential side gate wiring contained in the plural power module side wirings and connected with a gate electrode of the low potential side semiconductor device, and a low potential side emitter wiring connected with an emitter electrode of the low potential side semiconductor device and the corresponding wiring of the plural driver module side wirings are disposed adjacent to each other in such positions that flow directions of currents flowing in the low potential side gate wiring and the low potential side emitter wiring are opposed to each other.

According to an eighth aspect of the invention, it is preferable that, in the power converter of the seventh aspect, the emitter electrode of the low potential side semiconductor device is connected in parallel with the low potential side emitter wiring and an output terminal wiring connected with an output terminal which outputs the main current from the power module.

According to a ninth aspect of the invention, it is preferable that, in the power converter of any one of the first through eighth aspects, the power module and the driver module are disposed adjacent to each other such that the plane on which the plural power module side wirings are provided and the plane on which the plural driver module side wirings are provided become substantially parallel with each other. In this case, the conductors are disposed as integrated conductors in the vicinity of the plane on which the plural power module side wirings are provided and in the vicinity of the plane on which the plural driver module side wirings are provided.

According to a tenth aspect of the invention, it is preferable that, in the power converter of any one of the first through eighth aspects, the power module and the driver module are disposed such that the plane on which the plural power module side wirings are provided and the plane on which the plural driver module side wirings are provided become parallel with each other and overlap with each other. In this case, a first conductor disposed in the vicinity of the plane on which the plural power module side wirings are provided and a second conductor disposed in the vicinity of the plane on which the plural driver module side wirings are provided are electrically connected with each other by a fixing member which fixes at least either the first conductor or the second conductor.

According to an eleventh aspect of the invention, it is preferable that, in the power converter of any one of the first through eighth aspects, the power module and the driver module are disposed such that the plane on which the plural power module side wirings are provided and the plane on which the plural driver module side wirings are provided cross each other substantially at right angles. In this case, a first conductor disposed in the vicinity of the plane on which the plural power module side wirings are provided and a second conductor disposed in the vicinity of the plane on which the plural driver module side wirings are provided are electrically connected with each other by a fixing member which fixes at least either the first conductor or the second conductor.

According to a twelfth aspect of the invention, it is preferable that, in the power converter of any one of the first through eleventh aspects, the driver module has a multilayer wiring substrate. In this case, current flowing the driver module side wirings connected with the power module side wirings connected with the gate electrodes of the high potential side semiconductor device and the low potential side semiconductor device, and current flowing the driver module side wirings connected with the power module side wirings connected with the emitter electrodes of the high potential side semiconductor device and the low potential side semiconductor device pass through different layers in the driver module to reach the power source transformer.

Advantageous Effects of the Invention

According to the invention, a power converter capable of reducing losses and improving noise resistance is provided by utilizing a high-speed switching technology which does not cause oscillation of gate current of a power semiconductor device, and a technology which reduces leakage current produced by surge voltage.

DESCRIPTION OF EMBODIMENTS

Embodiment 1

An embodiment according to the invention is hereinafter described with reference to FIG. 1.

Figure 1:
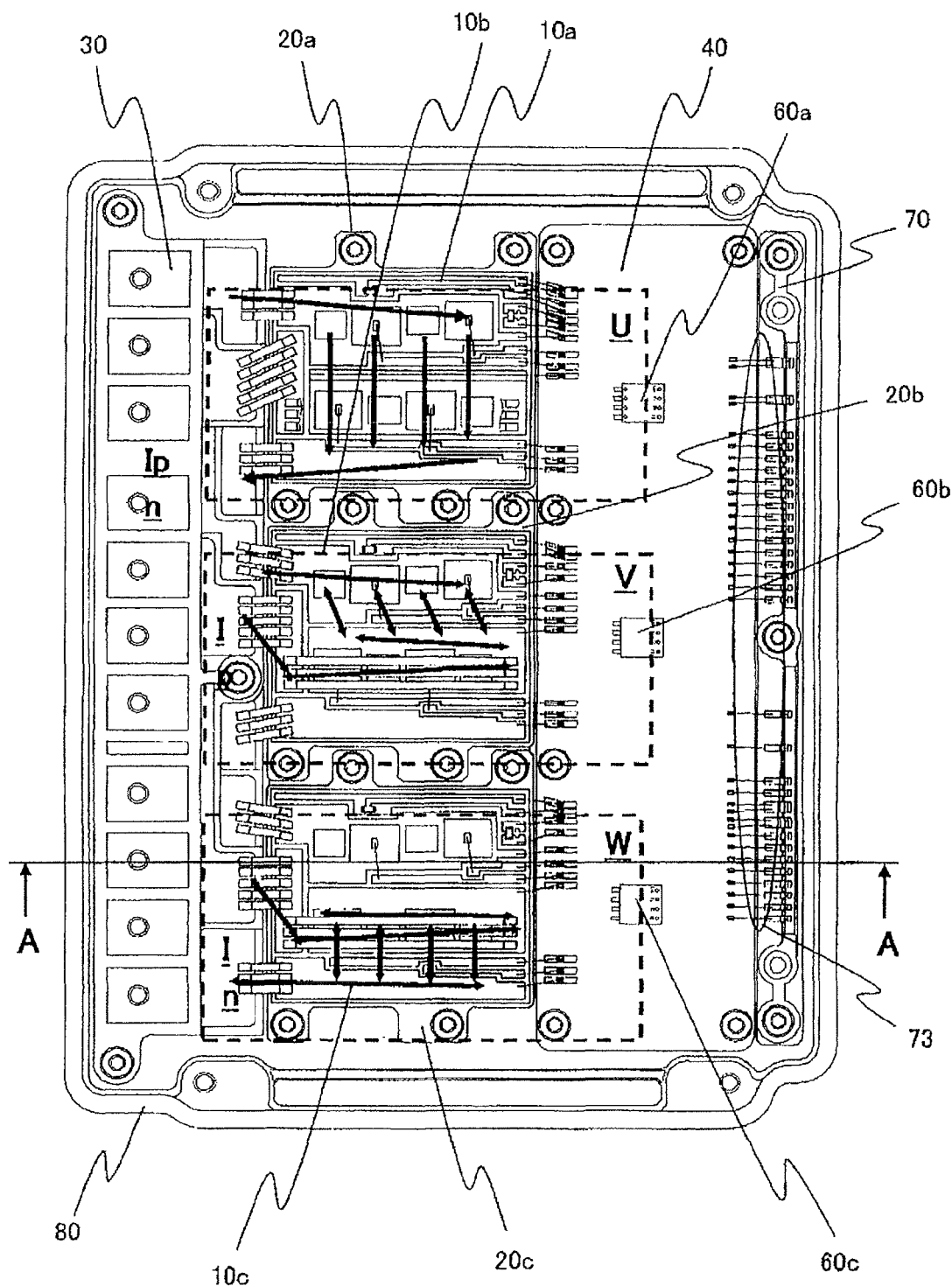
FIG. 1 illustrates the general structure of a power converter according to an embodiment of the invention.
Figure 2:
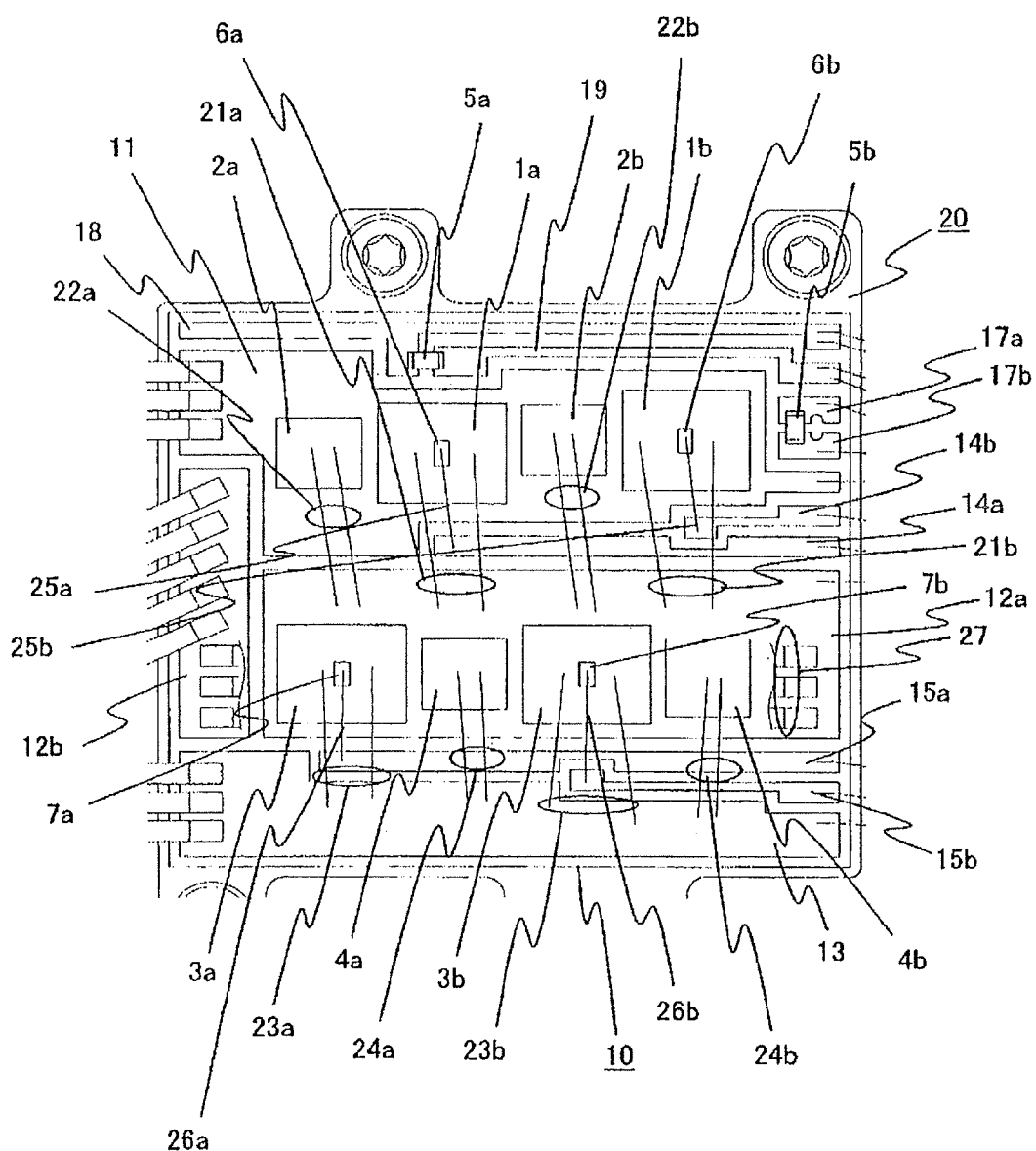
FIG. 2 illustrates the details of an enlarged part of an insulating substrate according to the embodiment of the invention.
Figure 3:
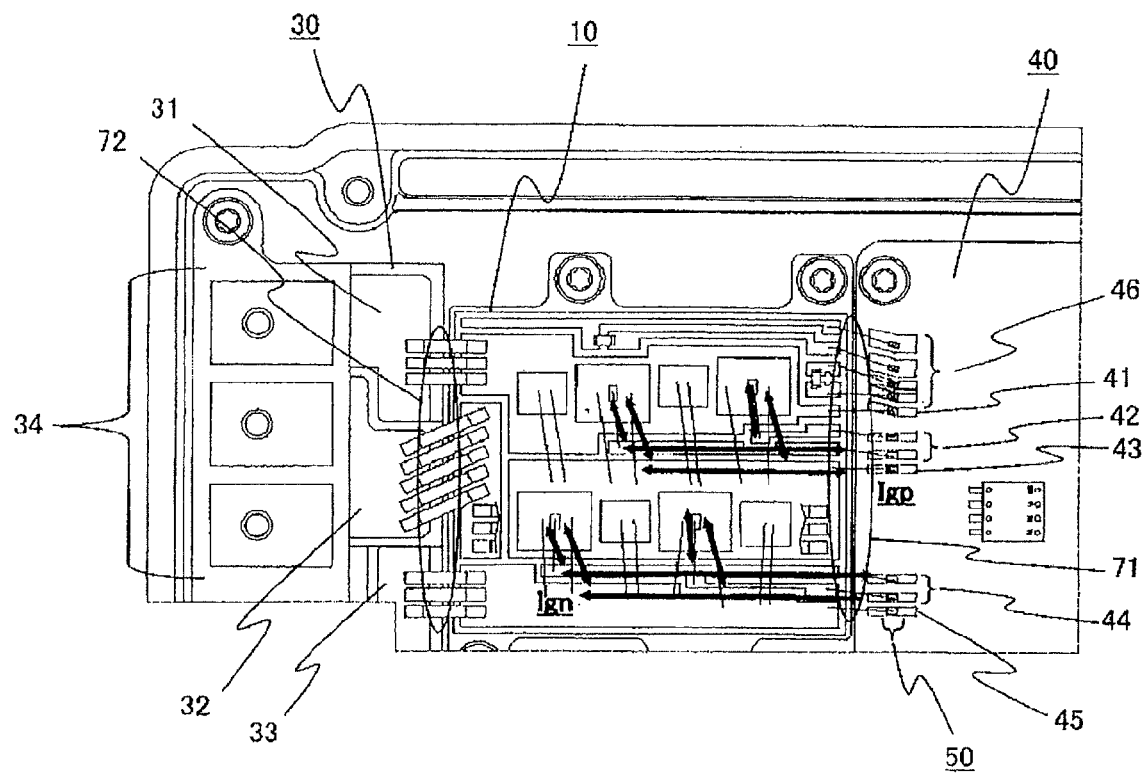
FIG. 3 illustrates the details of an enlarged part of a connection portion of the insulating substrate according to the embodiment of the invention.

FIG. 1 illustrates a power converter according to an example of the invention. FIGS. 2 and 3 illustrate the details of an enlarged part shown in FIG. 1. In FIG. 2, emitter electrodes and upper arm gate electrodes 6a and 6b are provided on the upper surfaces of upper arm IGBT (insulated gate bipolar transistor) chips 1a and 1b, respectively, and collector electrodes are provided on the lower surfaces of the chips 1a and 1b. On the other hand, anode electrodes are provided on the upper surfaces of upper arm diode chips 2a and 2b, and cathode electrodes are provided on the lower surfaces of the chips 2a and 2b. Lower arm IGBT chips 3a and 3b, and lower arm diode chips 4a and 4b have terminals similar to the corresponding terminals of the upper arm.

The lower surfaces of the upper arm IGBT chips 1a and 1b and the upper arm diode chips 2a and 2b are brazed by solder or the like onto a positive electrode wiring pattern 11 formed on an insulating substrate 10, while the emitter electrodes and the cathode electrodes on the upper surfaces are connected with an alternating current wiring pattern 12a via aluminum wires 21a, 21b, 22a, and 22b. The upper arm gate electrodes 6a and 6b are connected with upper arm gate wiring patterns 14a and 14b via aluminum wires 25a and 25b.

The lower surfaces of the lower arm IGBT chips 3a and 3b and the upper arm diode chips 4a and 4b are brazed by solder or the like to the alternating current wiring pattern 12a formed on the insulating substrate 10, while the emitter electrodes and the cathode electrodes on the upper surfaces are connected with a negative electrode wiring pattern 13 via aluminum wires 23a, 23b, 24a, and 24b. Lower arm gate electrodes 7a and 7b are connected with lower arm gate wiring patterns 15a and 15b via aluminum wires 26a and 26b.

The insulating substrate 10 is constituted by an insulating plate made of ceramic or the like having both surfaces of which metal foils such as copper foils are attached. The insulating substrate 10 is brazed by solder or the like to a base 20 formed by a copper plate or a composite material plate, for example, to be fixed thereto. The wiring patterns provided on the upper surface of the insulating substrate 10 include the negative electrode wiring pattern 13, the lower arm gate wiring patterns 15b and 15a, the alternating current wiring pattern 12a and an alternating current wiring pattern 12b, the upper arm gate wiring patterns 14a and 14b, and the positive electrode wiring pattern 11 in this order from the lower end of the insulating substrate 10, all of which patterns 11 through 15b are arranged substantially in the horizontal direction. Thermistor wiring patterns 17b, 17a, 19, and 18 are provided at the upper end of the insulating substrate 10. Thermistors 5a and 5b are disposed in the vicinity of the upper arm IGBT chips 1a and 1b, respectively, and connected with the thermistor wiring patterns 17a, 17b, 18, and 19 via solder or the like.

The alternating current wiring pattern 12a and the alternating current wiring pattern 12b are connected with each other via an aluminum ribbon 27 while crossing over the lower arm IGBT chips 3a and 3b and the diode chips 4a and 4b. FIG. 2 does not show the whole of the aluminum ribbon 27 but shows only the connection point thereof for easy understanding of the figure. While each of the aluminum wires shown in the figures has one or two wires, the number of the wires constituting each of the aluminum wires is not specifically limited. Similarly, the number of the ribbons constituting the aluminum ribbon is not specifically limited. The aluminum ribbon and the aluminum wires may be replaced with other connection conductors. The arrangements of the IGBT chips and the diode chips are not specifically limited.

As illustrated in FIG. 3, a terminal stand 30 has a positive electrode bus bar 31, an alternating current bus bar 32, and a negative electrode bus bar 33. The respective bus bars are supported and insulated by resin or other insulating materials, and formed by integral molding, for example. The terminal stand 30 is disposed adjacent to the insulating substrate 10. The respective bus bars on the terminal stand are located near the side adjacent to the insulating substrate 10. The respective bus bars on the terminal stand 30 are provided in the order of the negative electrode bus bar 33, the alternating current bus bar 32, and the positive electrode bus bar 31 from the lower end of the insulating substrate 10, that is, from one end thereof in the direction orthogonal to the direction where the insulating substrate 10 and the terminal stand 30 are disposed adjacent to each other. The negative electrode bus bar 33, the alternating current bus bar 32, and the positive electrode bus bar 31 are connected with the negative wring pattern 13, the alternating current wiring pattern 12b, and the positive electrode wiring pattern 11 on the insulating substrate 10, respectively, via an aluminum ribbon 72.

The connection portions of the respective bus bars 31, 32, and 33 and the aluminum ribbon 72 are positioned substantially in parallel with the corresponding wiring patterns 11, 12a, 12b, and 13 on the insulating substrate 10. The terminal stand 30 has a connection terminal 34 functioning as an interface with the outside. The interface between the connection terminal 34 and the outside will be described later. The aluminum ribbon 72 in the figure may be other types of connection conductor such as an aluminum wire.

The structure provided on the insulating substrate 10 and the terminal stand 30 functions as a power module which allows primary supply and cutoff of main current in the power converter according to this embodiment. The upper arm IGBT chips 1a and 1b constitute a high potential side semiconductor device which allows supply and cutoff of main current on the high potential side in the power module. Similarly, the lower arm IGBT chips 3a and 3b are connected with the upper arm IGBT chips 1a and 1b in series to function as a low potential side semiconductor device which allows supply and cutoff of main current on the low potential side.

The positive electrode wiring pattern 11, the alternating current wiring patterns 12a, 12b, the negative electrode wiring pattern 13, the upper arm gate wiring patterns 14a and 14b, and the lower arm gate wiring patterns 15a and 15b are disposed adjacent to each other on the power module in the order of the applied potentials. Each of the patterns 11 through 15b functions as a power module side wiring.

Patterns 41, 42, 43, 44, 45, and 46 electrically connected with the respective wiring patterns on the insulating substrate 10 are provided on the upper surface of a printed-wiring board 40 constituted by a multilayer of insulating and conductive layers. A terminal 50 is connected with each upper surface of the patterns 41, 42, 43, 44, 45, and 46 via a conductive material such as solder. The printed-wiring board 40 is disposed adjacent to the insulating substrate 10 on the side opposite to the terminal stand 30. The respective patterns on which the terminals 50 are provided are disposed on the printed-wiring board 40 on the side adjacent to the insulating substrate 10.

The structure provided on the printed-wiring board 40 functions as a driver module for controlling the foregoing power module in the power converter according to this embodiment. The respective patterns 41, 42, 43, 44, 45, and 46, and the terminals 50 connected therewith function as driver module side wirings connected with the power module side wirings provided on the power module in this embodiment.

The terminals 50 disposed on the respective patterns in the order of the negative electrode pattern 45, the lower arm gate pattern 44, the alternating current pattern 43, the upper arm gate pattern 42, the positive electrode pattern 41, and the thermistor pattern 46 from the lower end of the insulating substrate 10, that is, from one end thereof in the direction orthogonal to the direction where the insulating substrate 10 and the printed-wiring board 40 are disposed adjacent to each other, are connected with the negative electrode wiring pattern 13, the lower gate wiring patterns 15a and 15b, the alternating current wiring pattern 12a, the lower gate wiring patterns 14a and 14b, the positive electrode wiring pattern 11, the thermistor wiring patterns 17a, 17b, 18, and 19 on the insulating substrate 10 via an aluminum wire 71. Thus, the plural driver module side wirings in this embodiment are disposed in the order corresponding to the order of the power module side wirings in positions adjacent to the corresponding power module side wirings.

The connection portions of the respective patterns 41, 42, 43, 44, 45, and 46 with the terminals 50, the terminals 50, and the aluminum wire 71 are disposed substantially in parallel with the corresponding wiring patterns 11, 12a, 12b, 13, 14a, 14b, 15a, 15b, 17a, 17b, 18, and 19 on the insulating substrate 10. While the aluminum wire 71 has one wire in the figure, the number of the wires included in the aluminum wire 71 is not specifically limited. The aluminum ribbon may be replaced with other types of connection conductor. The aluminum wire 71 is not required to be connected with the terminals 50 but may be directly connected with the patterns on the printed-wiring board 40. The thermistor pattern 46 and the thermistor wiring patterns 17a, 17b, 18, and 19 may be provided near the lower end of the insulating substrate 10.

Figure 4:
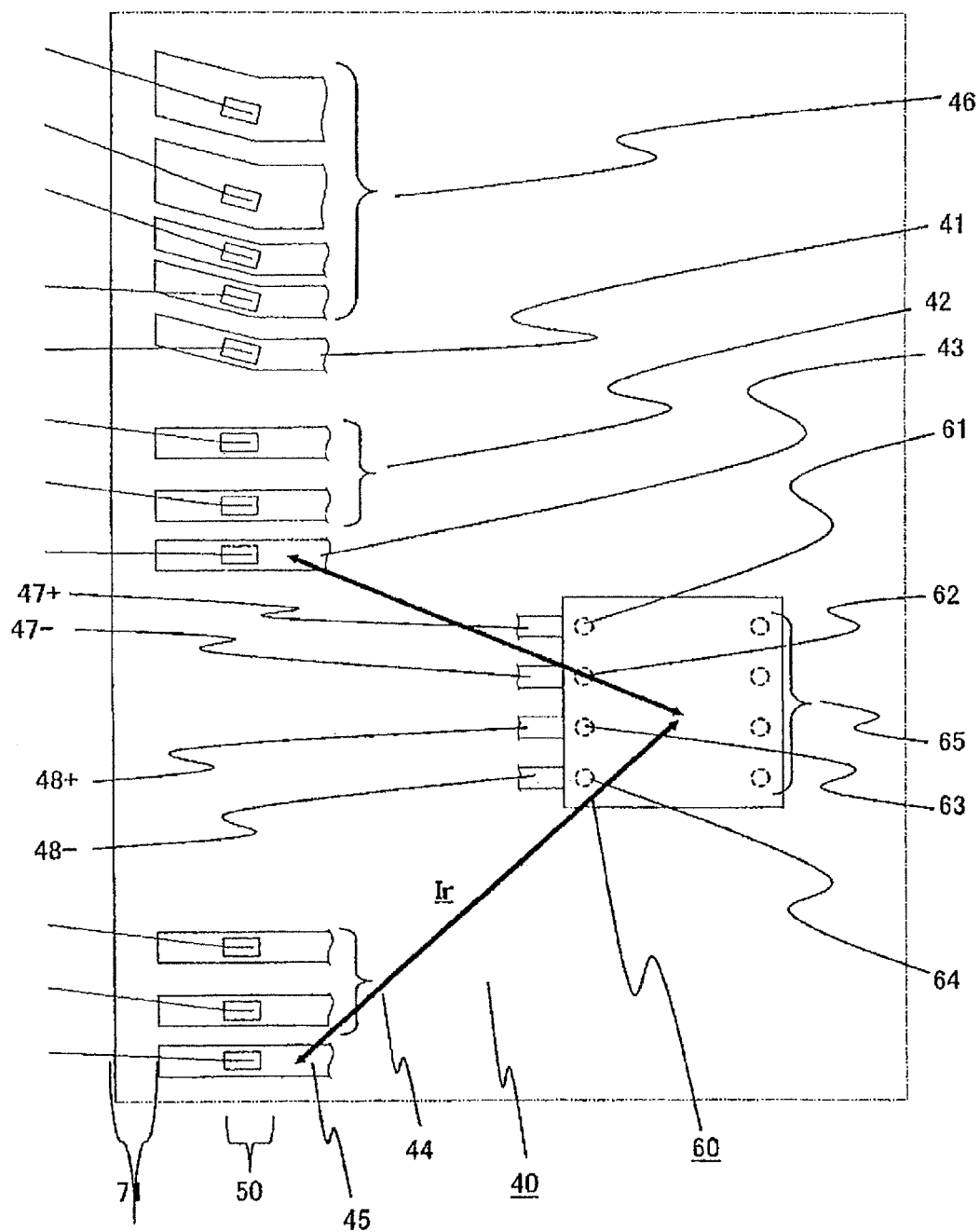
FIG. 4 illustrates the details of an enlarged part of a printed-wiring board according to the embodiment of the invention.
Figure 5:
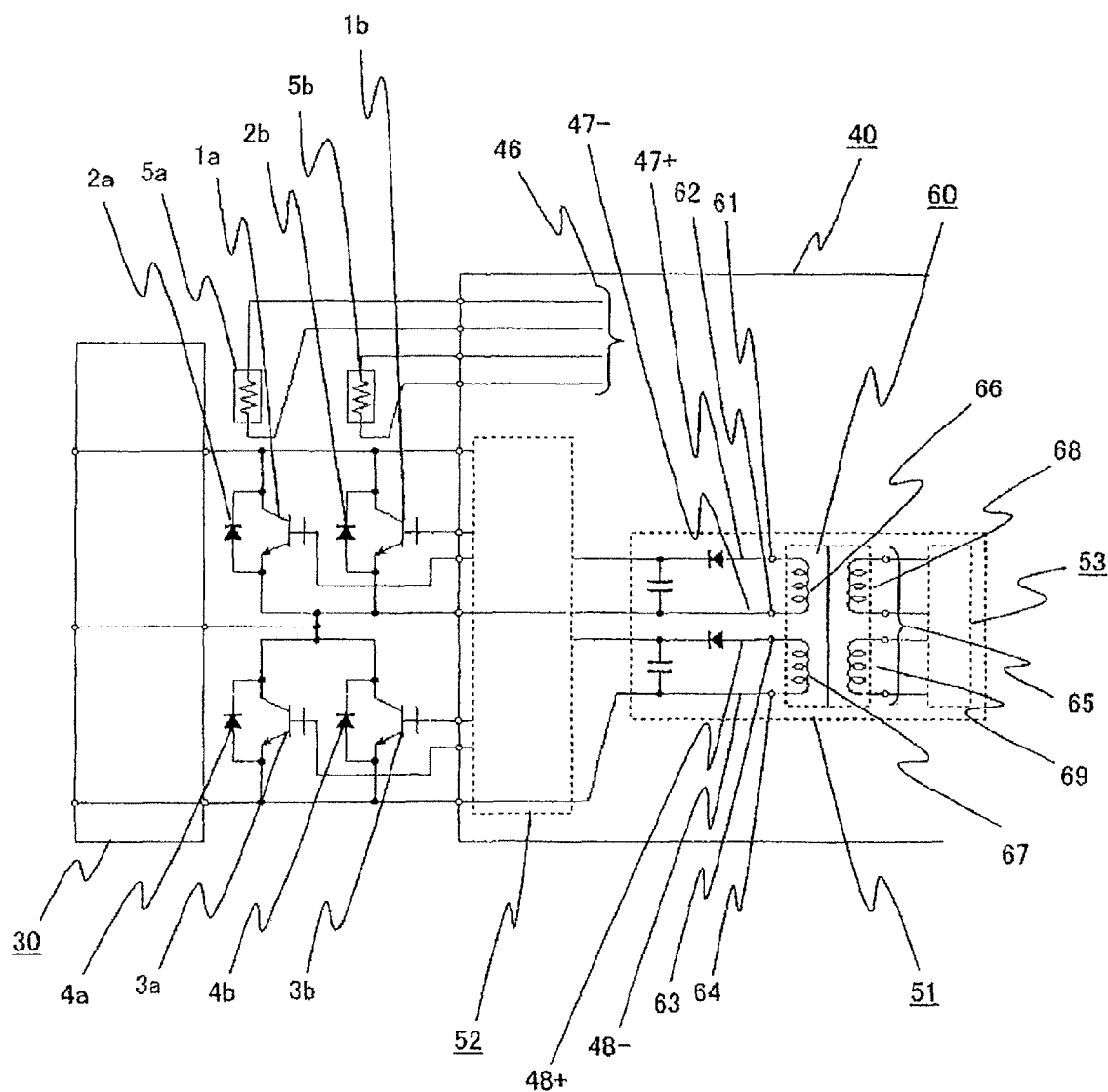
FIG. 5 is an equivalent circuit diagram of the power converter according to the embodiment of the invention.

FIG. 4 is an enlarged view of the printed-wiring board 40. FIG. 5 is an example of an equivalent circuit diagram of the invention. The printed-wiring board 40 includes at least a driver circuit 52 which turns on and off the upper arm IGBT chips 1a and 1b and the lower arm IGBT chips 3a and 3b, and a power source circuit 51 which produces power supply for the driver circuit. The power source circuit 51 has a power source transformer 60. The power source transformer 60 has an upper arm secondary coil 66, an upper arm secondary coil 67, a primary coil 69, and a feedback coil 68, all of which coils are insulated from each other.

An upper arm power source+terminal 61 and an upper arm power source−terminal 62 provided at one and the other ends of the upper arm secondary coil 66, respectively, are connected with an upper arm power source+pattern 47+ and an upper arm power source−pattern 47− formed on the printed-wiring board 40, respectively, by solder or the like. On the other hand, a lower arm power source+terminal 63 and a lower arm power source−terminal 64 provided at one and the other ends of the lower arm secondary coil 67, respectively, are connected with a lower arm power source+pattern 48+ and a lower arm power source−pattern 48− formed on the printed-wiring board 40, respectively, by solder or the like.

Similarly, low voltage terminals 65 provided at both ends of the primary coil 69 and the feedback coil 68 are connected with the patterns on the printed-wiring board 40 by solder or the like. The upper arm power source+terminal 61, the upper arm power source−terminal 62, the lower arm power source+terminal 63, and the lower arm power source−terminal 64 as terminals to which high voltage is applied, and the low voltage terminals 65 to which low voltage is applied are disposed along the outer periphery of the power source transformer 60 in the order of the upper arm power source+terminal 61, the upper arm power source−terminal 62, the lower arm power source+terminal 63, and the lower arm power source−terminal 64.

The positional relationship between the respective terminals on the power source transformer 60 is dependent on the positions of the alternating current pattern 43 and the negative electrode pattern 45 on the printed-wiring board 40. When the alternating current pattern 43 and the negative electrode pattern 45 are disposed in this order from above to below as illustrated in FIG. 3, the respective terminals are disposed in the order of the upper arm power source+terminal 61, the upper arm power source−terminal 62, the lower arm power source+terminal 63, and the lower arm power source−terminal 64 in the anticlockwise direction. When the alternating current pattern 43 and the negative electrode pattern 45 have the opposite positional relationship, the respective terminals are disposed in this order in the clockwise direction. The low voltage terminals 65 are disposed in such positions as not to be lined with the upper arm power source+terminal 61, the upper arm power source−terminal 62, the lower arm power source+terminal 63, and the lower arm power source−terminal 64. As illustrated in FIG. 5, the power source transformer 60, a diode, a capacitor, and a switching circuit 53 constitute a flyback converter to control the output voltage from the power source circuit 51. This converter is not limited to the flyback converter but may be a forward converter.

Figure 6:
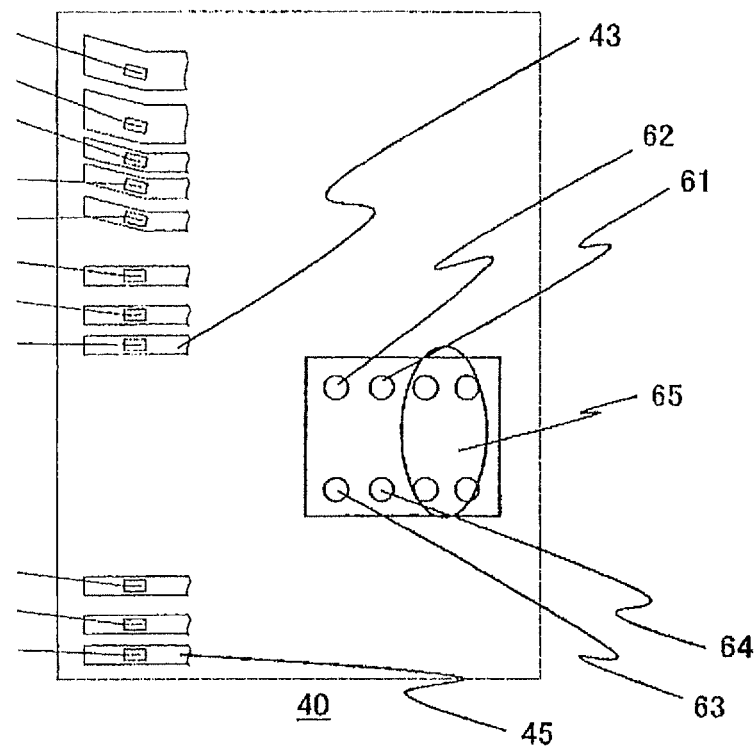
FIG. 6 illustrates the printed board and a power source transformer according to the embodiment of the invention.
Figure 7:
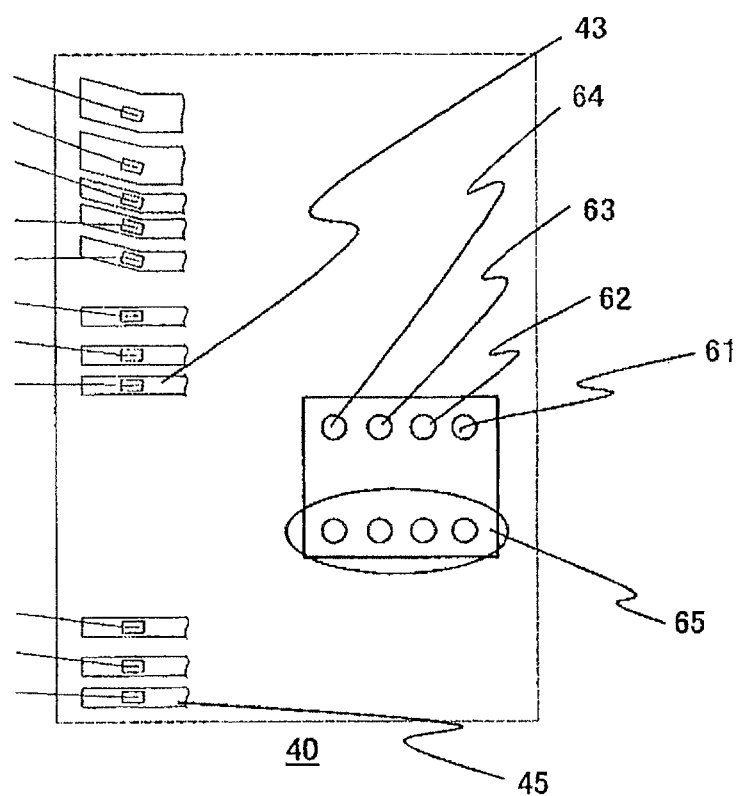
FIG. 7 illustrates the printed board and the power source transformer according to the embodiment of the invention.

FIGS. 6 and 7 show another example of the arrangement of the upper arm power source+terminal 61, the upper arm power source−terminal 62, the lower arm power source+terminal 63, the lower arm power source−terminal 64, and the low voltage terminals 65 on the power source transformer 60. In FIGS. 6 and 7, the alternating current pattern 43 and the negative electrode pattern 45 on the printed-wiring board 40 are disposed in this order in the direction from above to below similarly to the arrangement shown in FIG. 4, and the upper arm power source+terminal 61, the upper arm power source−terminal 62, the lower arm power source+terminal 63, and the lower arm power source−terminal 64 are disposed anticlockwise.

While the number of the low voltage terminals 65 is four in FIGS. 1 through 7, the number of the low voltage terminals 65 may be reduced by setting the primary coil 69 as high-side switching which uses a terminal common to both the primary coil and the feedback coil, for example. Alternatively, voltage may be applied to the primary coil from which the feedback coil is eliminated to perform feedforward control, for example. The order of the arrangement of the low voltage terminals 65 is not specifically limited. The shapes of the respective patterns on the printed-wiring board 40 are not limited to those shown in FIGS. 1 through 4. The upper arm power source+pattern 46, the upper arm power source−pattern 47, the lower arm power source+pattern 48, and the lower arm power source−pattern 49 may be provided in the lower layer rather than on the upper surface of the printed-wiring board 40.

In FIG. 1, bases 20a, 20b, and 20c and insulating substrates 10a, 10b, and 10c are arranged in a line and fixed to a frame 80 made of aluminum die casting by screws or the like. The terminal stand 30 and the printed-wiring board 40 are disposed such that the insulating substrates 10a, 10b, and 10c are sandwiched between the terminal stand 30 and the printed-wiring board 40, and are fixed to the frame 80 by screws or the like. A gate pin 70 whose terminal is arranged and fixed by insert molding or other methods is provided adjacent to the printed-wiring board 40, and fixed to the frame 80 by screws or the like to be connected with the printed-wiring board 40 via an aluminum wire 73. The gate pin 70 functions as an interface between the printed board 40 and the outside. The details of the interface with the outside will be described later.

Areas U, V, and W of the insulating substrates 10a, 10b, and 10c, the bases 20a, 20b, and 20c, the terminal stand 30, and the printed board 40 shown in FIG. 1 correspond to U-phase, V-phase, and W-phase of a three-phase motor. Each of the areas U, W, and W has a structure shown in FIGS. 2 through 5. The terminal stand 30 is not divided into the areas U, V, and W, but is constituted by a one-piece component made of insulating material such as resin. Similarly, the printed board 40 is constituted by a one-piece substrate. Power source transformers 60a, 60b, and 60c are equipped for the areas U, V, and W, respectively. The positions of the areas U, V, and W are not limited to those shown in the figure. The aluminum wire 73 may be constituted by other types of connection conductor.

According to this structure, main current flowing in the IGBT chips 1a, 1b, 3a, and 3b, and the diode chips 2a, 2b, 4a, and 4b goes along a channel Ip shown in FIG. 1 which passes through the positive electrode bus bar 31, the aluminum ribbon 72, the positive electrode wiring pattern 11, the upper arm chips, the aluminum wires 21a, 21b, 22a, and 22b, the alternating current wiring pattern 12a, the aluminum ribbon 27, the alternating current wiring pattern 12b, the aluminum ribbon 72, and the alternating current bus bar 32 in this order. Also, the main current flows along a channel In in FIG. 1 which passes through the alternating current bus bar 32, the aluminum ribbon 72, the alternating current wiring pattern 12b, the aluminum ribbon 27, the alternating current wiring pattern 12a, the lower arm chips, the aluminum wires 23a, 23b, 24a, and 24b, the negative electrode wiring pattern 13, the aluminum ribbon 72, and the negative electrode bus bar 33 in this order.

These channels Ip and In shown in FIG. 1 form approximately eddy-shaped flow and allow opposed currents to flow adjacent to each other. These eddies generate magnetic force lines around the axis of the eddy center in the direction perpendicular to the plane of the insulating substrate 10. The magnetic force lines thus generated produce eddy current in the conductive layer of the insulating substrate 10, the base 20, and the frame 80. The effect of the eddy current reduces the inductances in the main current channels Ip and In. Moreover, the opposed currents flowing adjacent to each other produce demagnetizing effect for the magnetic field generated by the current fluctuations. This effect also reduces the inductances in the main current channels Ip and In. Furthermore, in the structure which draws main current toward the alternating current wiring patterns 12a and 12b via the aluminum ribbon 27, the lengths of the current channels passing through the respective chips become substantially uniform. In this case, the main current can be divided into equal parts.

As a consequence of the foregoing effects, the inductances in the channels through which the main current flows become equal to or lower than the corresponding inductances in the related art, in which condition the voltage surge generated by the main current switching decreases. By reduction of the voltage surge, the main current switching speed increases, wherefore losses decrease. Moreover, by reduction of the voltage surge, the withstand voltage of the chips can be kept lower, in which case the voltage drop produced at the time of current flow decreases along with reduction of the withstand voltage of the chips. Thus, the steady-state losses produced at the time of current flow also decrease. By reduction of these losses, the size of a cooler for cooling the chips or the cooling capability thereof can be reduced, which contributes to cost reduction of the cooler. Moreover, the structure which divides the current into equal divisions between the chips can reduce each area of the chips, or decrease the number of the chips for each arm from three to two as shown in FIG. 1, for example. Similarly, the insulation substrate 10 and the base 20 can be small-sized, which contributes to miniaturization and cost reduction of the power converter.

At the time of switching of the main current, recovery current flows in the diode chips 2a, 2b, 4a, and 4b when the IGBT chips 1a, 1b, 3a, and 3b are turned on. The recovery current flows into a channel Ipn of the negative electrode bus bar 33 chiefly from the positive electrode bus bar 31 via the upper and lower arms as illustrated in FIG. 1. The recovery current channel Ipn forms a substantially U shape. According to this structure, magnetic force lines are generated around the axis of the center of the U shape in the direction perpendicular to the plane of the insulating substrate 10, and produce eddy current in the conductive layer of the insulating substrate 10, the base 20, and the frame 80. This eddy current reduces the inductance in the recovery current channel Ipn.

The recovery current, which can be generated in an extremely short period of 1 nanosecond or shorter, produces a great change of current. Thus, the surge voltage generated by the recovery current is generally dependent on the inductance of the conductor connected with the chip. According to the structure of the invention, the aluminum wires 21*a*, 21*b*, 22*a*, 22*b*, 23*a*, 23*b*, 24*a*, and 24*b* as the connection conductors between the IGBT chips 1*a*, 1*b*, 3*a*, and 3*b*, and the diode chips 2*a*, 2*b*, 4*a*, and 4*b* have substantially the same length. Therefore, the respective inductances are uniform.

As a consequence of the foregoing effects, the inductance in the recovery current channel Ipn becomes equal to or lower than the corresponding inductance in the related art, and the voltage surge generated by the recovery current is equalized based on the fact that the inductances of the connection conductors of the respective chips are uniform. Accordingly, the switching speed increases, while the withstand voltage of the chips lowers, in which condition the size of the power converter and the cost of the cooler and the power converter decrease. In FIG. 1, the current channels Ip, In, and Ipn are separately shown in the areas U, V, and W, respectively. However, the current channels Ip, In, and Ipn are formed not only in the specific areas shown in the figure, but also in all of the areas U, V, and W.

The current channels Ip, In, and Ipn discussed in this embodiment are produced by such an arrangement that the connecting portions between the terminal stand 30 and these channels Ip, In, and Ipn on the insulating substrate 10 are disposed at one end of the insulating substrate 10. In other words, the current channels Ip, In, and Ipn can be formed by such an arrangement that both the input terminals through which the main current is inputted to the power module and the output terminal through which the main current is outputted from the power module are disposed at one end of the power module, i.e., the end opposite to the driver module in this embodiment.

Figure 8:
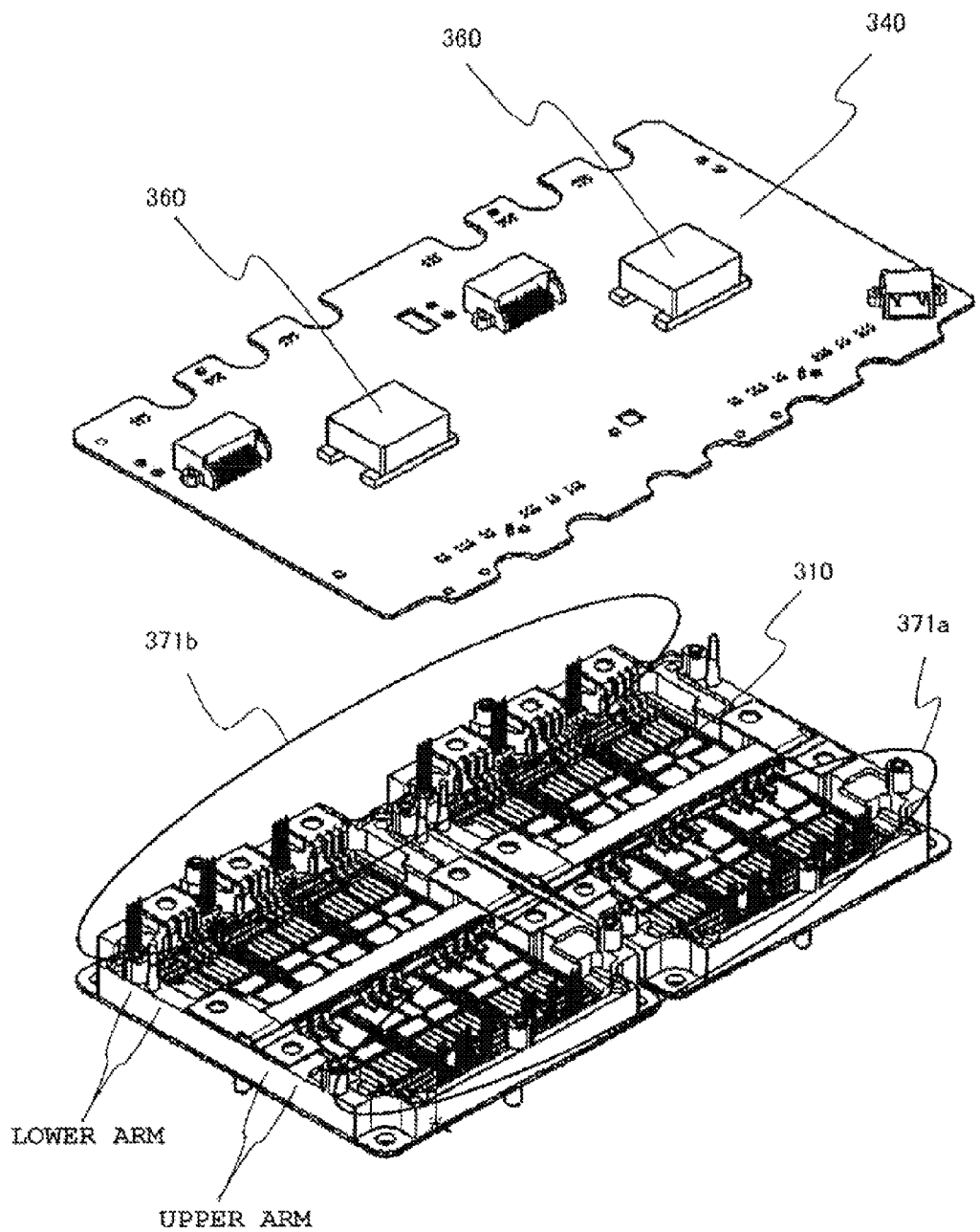
FIG. 8 illustrates an example of a related art.

FIG. 8 illustrates a power converter according to a related art as a comparison example for this embodiment. An insulating substrate 310 on which the chips such as the upper arm IGBT chip 1*a* according to this embodiment are mounted is disposed in the lower layer in such a condition that the upper arm and the lower arm are separated. A printed board 340 containing the driver circuit and the power source circuit is disposed on the insulating substrate 310 and fixed thereto. The insulating substrate 310 and the printed board 340 are connected with each other via gate pins 371*a* and 371*b* provided on the front and rear sides. Power source transformers 360 are disposed substantially at the center of the printed board 340.

In the related art, current flowing between the insulating substrate 310 and the printed board 340 such as gate current and leakage current produced by surge voltage passes through the gate pins 371*a* and 371*b*. In the respective current channels, the current channel which passes through the insulating substrate 310, the gate pin 371*a*, the printed board 340, and the gate pin 371*b*, and returns to the insulating substrate 310 has the longest length. The inductance in this current channel is high. Moreover, in the current channel which makes a round, the current becomes a loop current around the space between the insulating substrate 310 and the printed board 340. In the related art, therefore, there are produced oscillation of gate current along with the increase in the switching speed, and lowering of noise resistance by the loop current and the high inductance. Under this condition, the chips can be accidentally turned on, and can be burnt in the worst case.

According to the structure of the invention, however, the gate current flows along a channel Igp shown in FIG. 3 which passes through the driver circuit 52, the upper arm gate pattern 42, the terminal 50, the aluminum wire 71, the upper arm gate wiring patterns 14*a* and 14*b*, the aluminum wires 25*a* and 25*b*, the gate electrodes 6*a* and 6*b*, the emitter electrodes of the IGBT chips 1*a* and 1*b*, the aluminum wires 21*a* and 21*b*, the alternating current wiring pattern 12*a*, the aluminum wire 71, the terminal 50, and the alternating current pattern 43, and returns to the driver circuit 52. Accordingly, the upper arm gate wiring patterns 14*a* and 14*b* function as high potential side gate wirings, while the alternating current wiring pattern 12*a* functions as a high potential side emitter wiring in this embodiment.

On the other hand, the gate current flows along a channel Ign shown in FIG. 3 which passes through the driver circuit 52, the lower arm gate pattern 44, the terminal 50, the aluminum wire 71, the lower arm gate wiring patterns 15*a* and 15*b*, the aluminum wires 26*a* and 26*b*, the gate electrodes 7*a* and 7*b*, the emitter electrodes of the IGBT chips 3*a* and 3*b*, the aluminum wires 23*a* and 23*b*, the negative electrode wiring pattern 13, the aluminum wire 71, the terminal 50, and the negative electrode wiring pattern 45, and returns to the driver circuit 52. Accordingly, the lower arm gate wiring patterns 15*a* and 15*b* function as low potential side gate wirings, while the negative electrode wiring pattern 13 functions as a low potential side emitter wiring in this embodiment.

According to this embodiment, currents constantly opposed to each other flow adjacent to each other in the gate current channels Igp and Ign as illustrated in FIG. 3. As discussed above, the effect of demagnetizing the magnetic field generated as a result of the change of current is produced when opposed currents flow adjacent to each other. This effect reduces the inductances. Moreover, since the insulating substrate 10 and the printed board 40 are disposed adjacent to each other, the length of the aluminum wire 71 as the connection conductor becomes the minimum.

As a consequence of the foregoing effects, the inductances in the gate current channels Igp and Ign become considerably lower than those in the related art shown in FIG. 8. In this case, the possibility of oscillation of gate current resulting from increase in the switching speed is eliminated, wherefore the switching speed further increases. Accordingly, the switching loss decreases, and the fuel cost of the vehicle improves. Moreover, the noise resistance rises by reduction of the inductances, and the reliability increases by prevention of the conditions which accidentally turn on the chips as noted above or other problems.

The problem of the leakage current produced by the surge voltage arises from transmission of the surge voltage. According to the structure in this embodiment, the surge voltage generated by switching in FIGS. 4 and 5 is transmitted to the printed-wiring board 40 via the aluminum wire 71 and the terminals 50. In this case, leakage current having a high frequency is produced from the surge voltage thus transmitted, the stray capacitances of the printed-wiring board 40 and the power source transformer 60, and the capacitances of other components contained in the printed-wiring board 40.

For example, the surge voltage transmitted to the alternating current pattern 43 reaches the upper arm power source–pattern 47– connected via the internal pattern of the printed-wiring board 40. As a result, leakage current between the upper arm secondary coil 66 and the lower arm secondary coil of the power source transformer 60 is produced from the surge voltage transmitted to the upper arm power source–pattern 47–, and the stray capacitance between the upper arm secondary coil 66 and the lower arm secondary coil. This leakage current chiefly flows along a channel Ir shown in FIG. 4 which passes through the IGBT chips 3a and 3b or the diodes 4a and 4b, the alternating current wiring pattern 12a, the aluminum wire 71, the wiring 50, the alternating current pattern 43, the upper arm power source–pattern 47–, the upper arm secondary coil 66, the lower arm secondary coil 67, the lower arm power source–pattern 48–, the negative electrode pattern 45, the wiring 50, the aluminum wire 71, and the negative electrode wiring pattern 13 in the shape of loop via the aluminum wires 23a, 23b, 24a, and 24b.

The leakage current channel Ir shown in FIG. 4 forms a substantially V shape within the printed-wiring board 40, and also forms a substantially V shape on the insulating substrate 10 with the lower arm chips corresponding to the bottom of the V shape. According to this structure, the leakage current flows while forming eddies on the printed-wiring board 40 and the insulating substrate 10. These eddies generate magnetic force lines around the axis of the eddy center in the direction perpendicular to the planes of the insulating substrate 10 and the printed-wiring board 40. These magnetic force lines produce eddy current in the conductive layer of the insulating substrate 10, the conductive layer of the printed-wiring board 40, the base 20, and the frame 80. As a consequence of these effects, the inductance in the leakage current channel Ir decreases, whereby the noise produced by the leakage current lowers. Other leakage currents produced by the surge voltage loop between the insulating substrate 10 and the printed-wiring board 40, and therefore provide similar effects.

It is estimated that the leakage current produced by the surge current flows in any positions on the printed-wiring board 40. On the other hand, current flows in the channel where the energy during flow becomes the minimum, and therefore flows in an area where the potential difference between the flow channels is lower. According to the structure of the invention, the wiring patterns 41, 42, 43, 44, 45, 47+, 47–, 48+, and 48– through which the surge voltage is chiefly transmitted in the wiring patterns on the printed-wiring board 40 are disposed such that the average voltage between the adjoining patterns becomes the minimum, that is, disposed in the order of the potentials of the voltages to be applied. According to this structure, the leakage current more easily flows between the opposed patterns. Thus, the inductances decrease by the effect of demagnetizing the magnetic field generated by the opposed currents, and the noise produced by the leakage current lowers.

Moreover, the wiring patterns 41, 42, 43, 44, 45, 47+, 47–, 48+, and 48– are disposed on the printed-wiring board 40 substantially in the order of the average voltage, and can be connected without crossing each other. In other words, wiring is allowed in the same manner as in the equivalent circuit diagram of the printed-wiring board 40 shown in FIG. 5, wherefore no line crosses other lines. According to this structure, the wiring patterns 41, 42, 43, 44, 45, 47+, 47–, 48+, and 48– do not interfere with each other, and have short wiring lengths and low inductances. As a consequence of these effects, the noise produced from the leakage current generated by the surge voltage decreases, and the noise resistance increases by reduction of the inductances. Therefore, a power converter having high reliability can be provided.

According to the structure of the invention shown in FIGS. 1 through 7, the thermistors 5a and 5b are disposed in the vicinity of the chips, and the thermistor wiring patterns 17a, 17b, 18, and 19, and the thermistor pattern 46 forming a transmission line for the thermistors 5a and 5b are provided on the upper boundaries of the respective areas U, V, and W.

Thus, the thermistor pattern 46 can be connected with the gate pin 70 without crossing the areas U, V, and W.

The low voltage terminals 65 of the power source transformer 60 and the switching circuit 53 are also disposed on the boundaries between the respective areas U, V, and W. According to this structure, signals lines and others can be similarly connected with the gate pin 70 without crossing the areas U, V, and W. In this case, the surge voltage generated by switching as discussed above has only small effects on the signal lines of the thermistors 5a and 5b, the switching circuit 53, and the signal line of the switching circuit 53. Similarly, the voltage fluctuations of the driver circuit 52 have only small effects. Thus, high reliability can be maintained by reduction of the noise of the signal lines and increase in the accuracy of the signal output.

Figure 9:
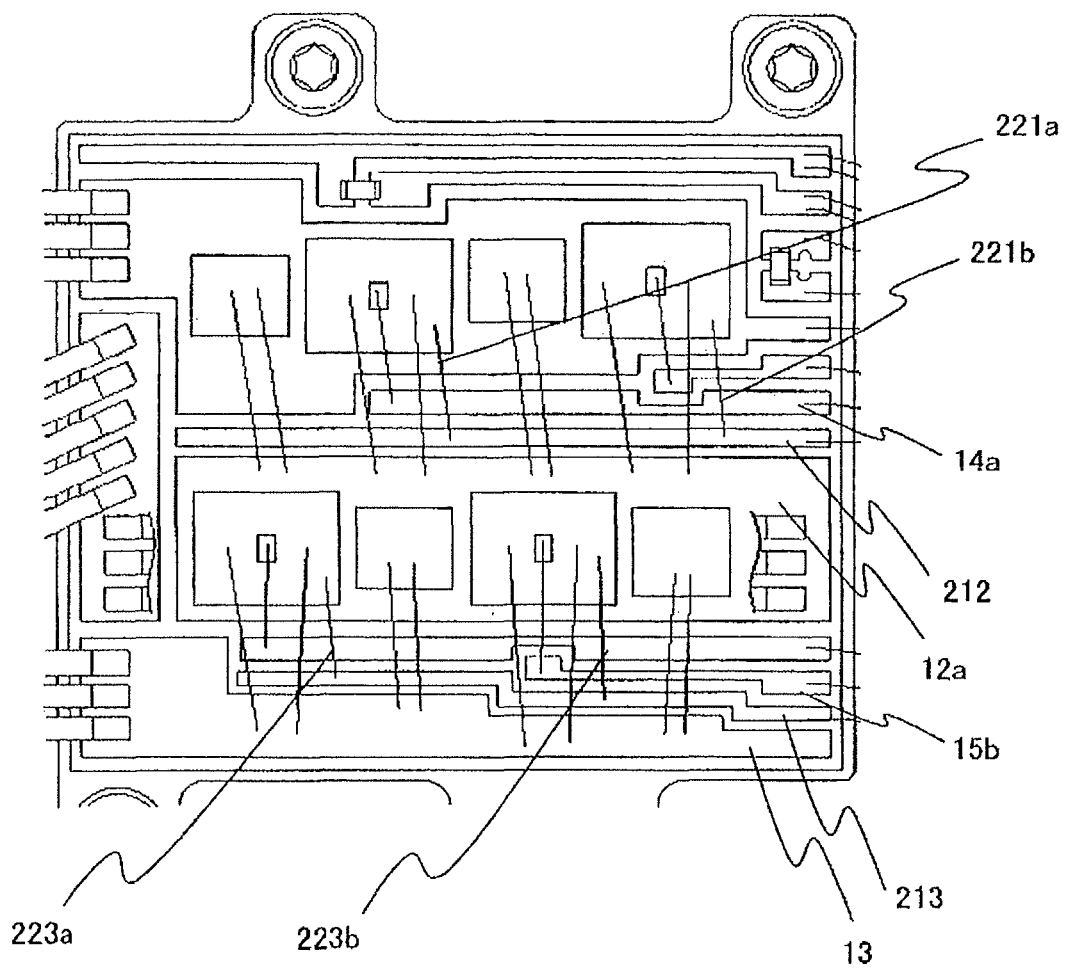
FIG. 9 is a cross-sectional view of the power converter according to the embodiment of the invention.
Figure 13:
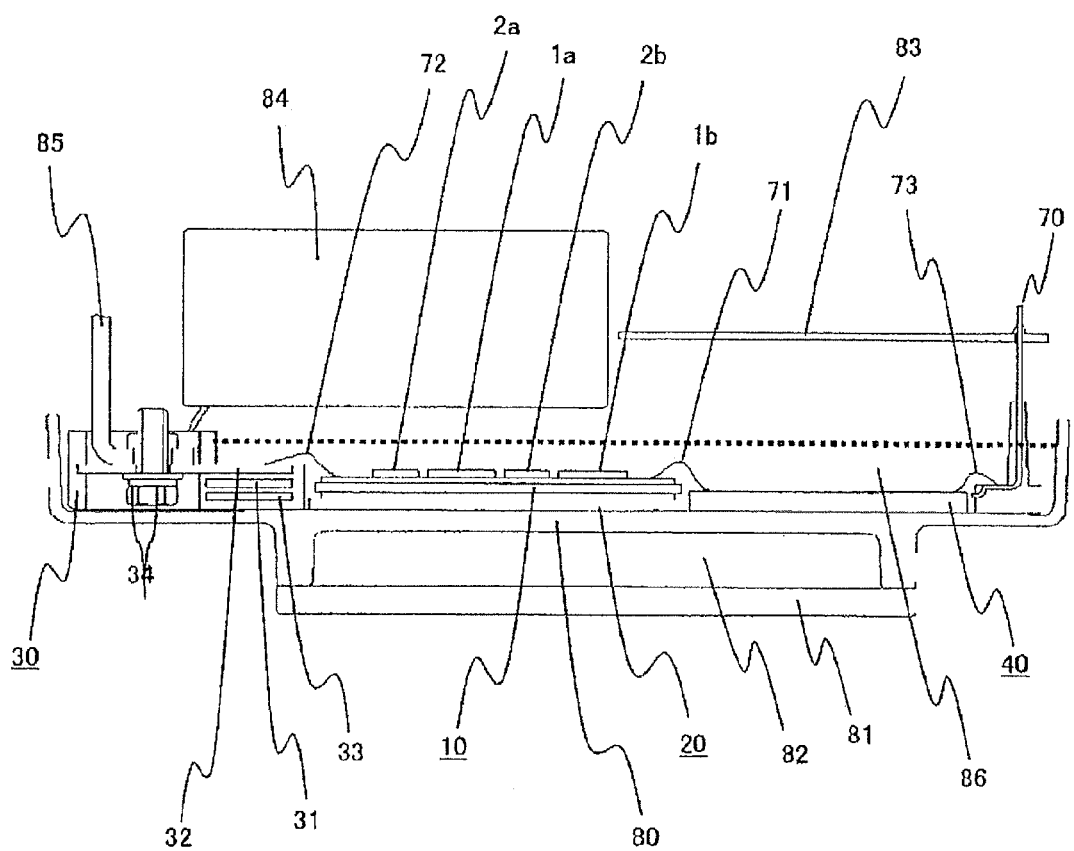
FIG. 13 illustrates the details of an enlarged part of an insulating substrate according to a still further different embodiment of the invention.

The general structure of the power converter according to this embodiment is now described. FIG. 13 is a cross-sectional view taken along a line A-A in FIG. 1. According to this embodiment, the driver module and the power module are provided adjacent to each other such that the surface on which the driver module side wirings discussed above are disposed and the surface on which the power module side wirings discussed above are provided are disposed substantially parallel with each other as illustrated in FIG. 9. In the figure, the terminal stand 30, the insulating substrate 10, the printed-wiring board 40, and the gate pin 70 are attached via screws or the like to one flat surface of the frame 80 as a one-piece conductor. Similarly, the aluminum ribbon 72, and the aluminum wires 71 and 73 connecting the respective components are disposed substantially on the same flat surface. In this case, the current channels Ip, In, Ipn, Igp, Ign, Ir, and Ihv discussed above pass on the same plane. Thus, the respective current loops generate eddy current on the frame 80 and reduce the inductances.

The positive electrode bus bar 31, the alternating current bus bar 32, and the negative electrode bus bar 33, each having a plate shape, are laminated on each other on the terminal stand 30. The respective bars 31, 32, and 33 are made of resin, and formed and held by insert molding, for example. The external interface 34 is produced by these bus bars extended in the left direction in the figure, and connected with an external bus bar 85, or a direct current capacitor 84 via screws or the like. The figure shows the connection portion between the alternating current bus bar 32 and the external bus bar 85.

According to this structure, the respective bus bars 31, 32, and 33 on the terminal stand 30 can be formed from one plate such as a copper plate, by metal press working which requires only a small number of steps, and therefore can lower the cost. Moreover, the arrangement of all the components of the external interface 34 in a line can facilitate the connection between the external bus bar 85 and the capacitor 84, and shorten the processing time. Furthermore, by lamination of the respective bus bars, the currents flowing in the bus bars overlap with each other, in which condition the inductances of the bus bars decrease.

The gate pin 70 is connected with a control board 83 containing an upper control circuit which controls the driver circuit 52 and others on the printed-wiring board 40. In this embodiment, the gate pin 70 and the control board 83 are brazed to each other by solder. The power source circuit 51, the driver circuit 52, the switching circuit 53 to which high voltage is applied are mounted on the printed-wiring board 40, and sectioned into the areas U, V, and W as discussed above. According to this structure, signals flowing in the gate pin are weak current signals such as PWM signals of the thermistors 5a and 5b and the driver circuit 52, ON/OFF signals of the switching circuit 53, and the power source line of the power source circuit 51. In this case, the insulation distance between the respective pins of the gate pin 70 can be shortened. Thus, the size and the cost of the gate pin 70 can be reduced.

The frame 80 has a cooling water channel 82 for cooling the chips 1a, 1b, 2a, 2b, 3a, 3b, 4a, and 4b below the above-noted flat surface to which the insulating substrate 10 and the printed-wiring board 40 are attached. The cooling water channel 82 is disposed substantially in an area just below the insulating substrate 10 and the printed-wiring board 40, and tightly closed by a water channel cover 81 formed by aluminum die casting or the like. The frame 80 has a fin within the cooling water channel 82, for example. According to this structure, the cooling water channel 82 simultaneously cools heat generated by the printed-wiring board 40 as well, which contributes to reduction of the sizes of the heating components such as the power source transformer 60 and reduction of the cost.

The area of the frame 80 up to a dotted line in the figure, for example, is filled with gel 86 such as silicon compound gel such that the gel 86 covers the aluminum ribbon 72, the aluminum wires 71 and 73 and others. The frame 80 has walls outside the terminal stand 30, the insulating substrate 10, the printed board 40, and the gate pin 70 so as to cover the gel 86 by the walls. This structure eliminates the necessity for equipping walls connecting the terminal stand 30 and the gate pin 70, that is, the wall covering the outer periphery of the insulating substrate 310 equipped in the related art shown in FIG. 8. Thus, reduction of the sizes of the terminal stand 30 and the gate pin 70, and reduction of the cost can be achieved. Moreover, heat generated from the printed board 40 can be diffused through the gel 86, which contributes to reduction of the sizes of the heat generating components such as the power source transformer 60.

As described above, the respective terminals of the driver module side wirings, the power module side wirings, and the power source transformer 60 included in the power converter in this embodiment are arranged in correspondence with each other. In this case, inductances can be lowered by avoidance of crossing of the wirings. Moreover, the frame 80 is provided as a conductor electrically connected in such a condition as to surround magnetic flux generated by leakage current looping at least through the power source path transformer 60, the driver module side wirings, and the power module side wirings. In this case, the inductance of the leakage current can be reduced by the cancelling effect of the eddy current generated in the frame 80. Thus, a highly reliable, low-cost, and compact power converter can be produced.

Embodiment 2

Figure 10:
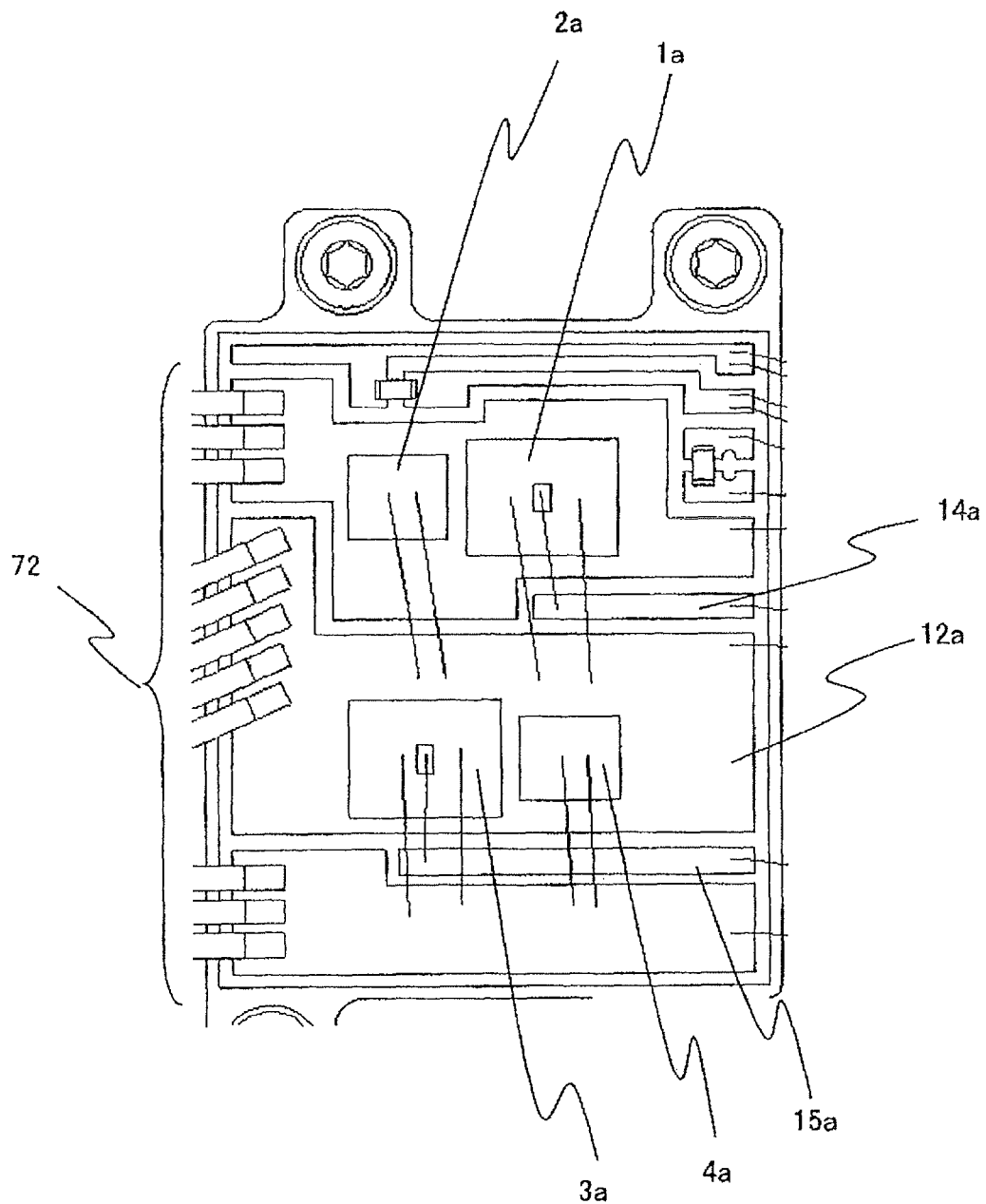
FIG. 10 illustrates the details of an enlarged part of an insulating substrate according to a different embodiment of the invention.

FIG. 9 illustrates the details of an enlarged part of the insulating substrate 10 of a power converter according to this embodiment, corresponding to FIG. 2 in the embodiment 1. According to this embodiment, an upper gate return wiring pattern 212 is provided between the gate wiring pattern 14a and the alternating current wiring pattern 12a on the insulating substrate 10 substantially in parallel with the respective patterns 14a and 12a as illustrated in FIG. 10. The upper gate return wiring pattern 212 is connected with the emitter electrodes of the upper arm IGBT chips 1a and 1b via aluminum wires 221a and 221b. The upper gate return wiring pattern 212 is further connected with the terminal 50 of the alternating current pattern 43 via the aluminum wire 71. In this embodiment, therefore, the upper gate return wiring pattern 212 functions as a high potential side emitter wiring. On the other hand, the alternating current wiring pattern 12a functions as a low potential side collector wiring.

Similarly, a lower gate return wiring pattern 213 is provided between the lower gate wiring pattern 15b and the negative electrode wiring pattern 13 on the insulating substrate 10 substantially in parallel with the respective patterns 15b and 13 in this embodiment. The lower gate return wiring pattern 213 is connected with the emitter electrodes of the lower arm IGBT chips 3a and 3b via aluminum wires 223a and 223b. The lower gate return wiring pattern 213 is further connected with the terminal 50 of the negative electrode wiring pattern 45 via the aluminum wire 71. In this embodiment, therefore, the lower gate return wiring pattern 213 functions as a low potential side emitter wiring. On the other hand, the negative electrode wiring pattern 13 functions as an output terminal wiring. Other components included in the power converter in this embodiment are similar to the corresponding components shown in FIGS. 1 through 7.

According to this structure, the gate current channel Igp shown in FIG. 3 passes not through the alternating current wiring pattern 12a but through the upper gate return wiring pattern 212. On the other hand, the gate current channel Ign shown in FIG. 3 passes not through the negative electrode wiring pattern 13 but through the lower gate return wiring pattern 213. The gate current channels in FIG. 9 are channels where constantly opposed currents flow adjacent to each other similarly to the current channels Igp and Ign shown in FIG. 3, and therefore provide effects similar to those of the current channels shown in FIG. 3.

Figure 11:
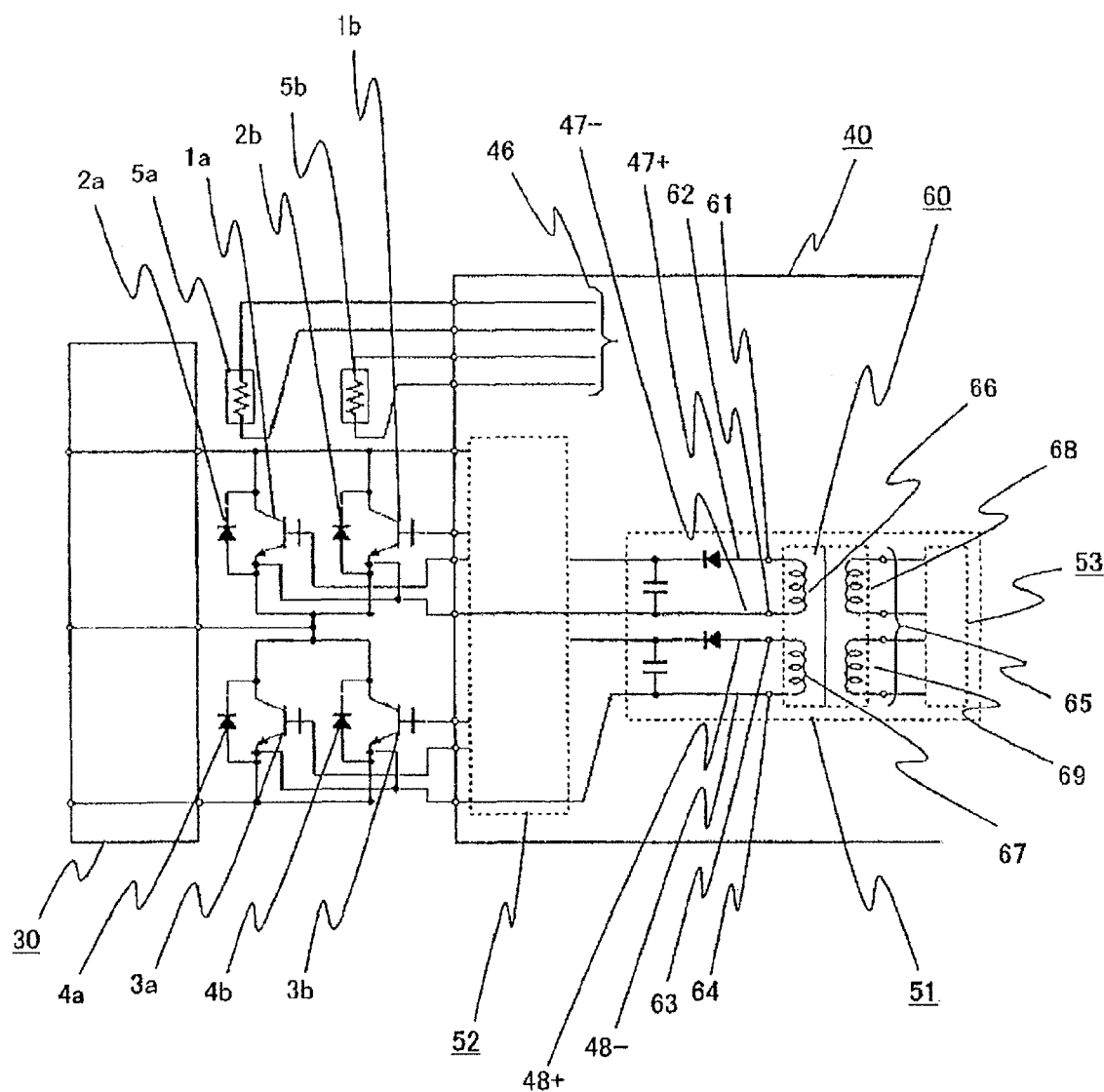
FIG. 11 is an equivalent circuit diagram of a power converter according to the different embodiment of the invention.

FIG. 11 is an equivalent circuit diagram of the power converter according to this embodiment, corresponding to FIG. 5 in the embodiment 1. This circuit structure can stabilize the respective gate voltages in the gate current circuits Igp and Ign in this embodiment.

Embodiment 3

Figure 12:
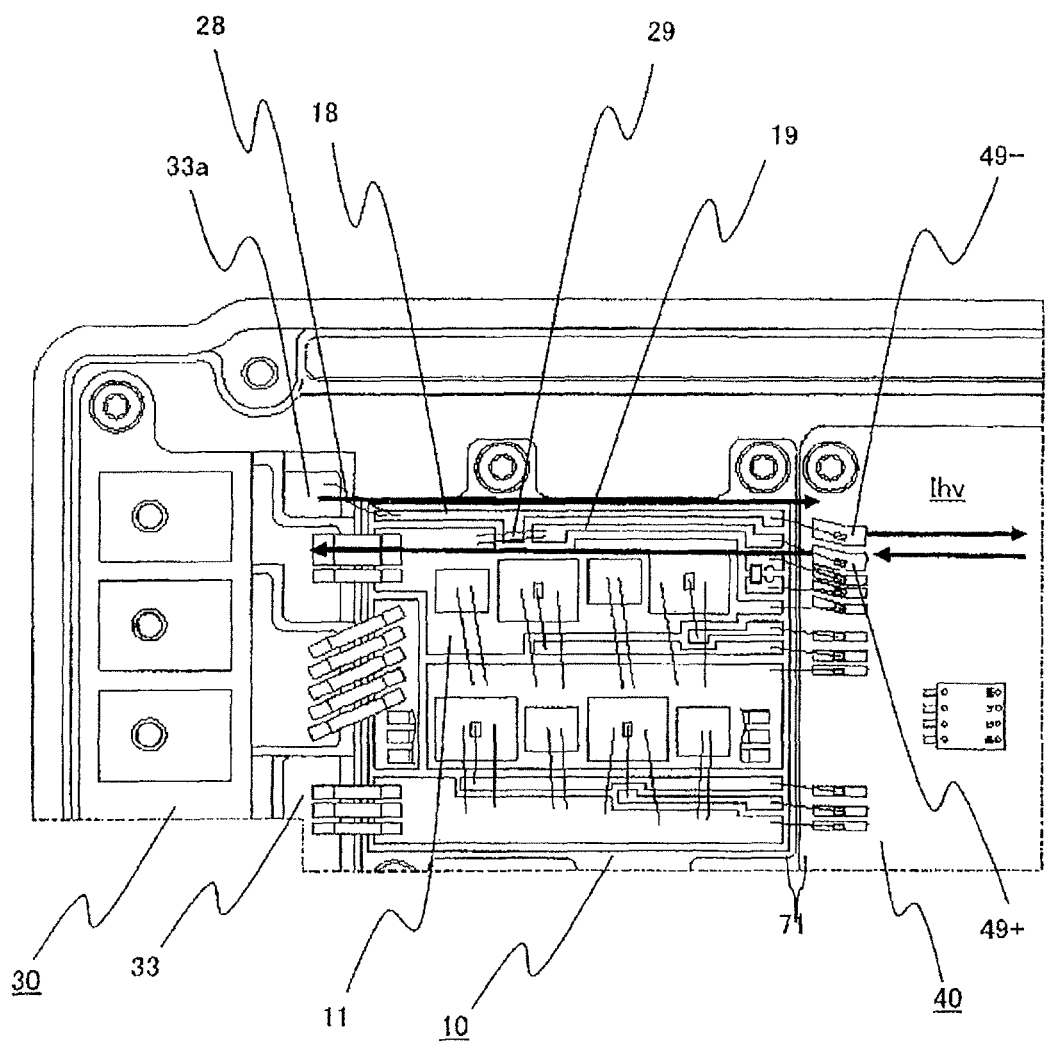
FIG. 12 illustrates the details of an enlarged part of an insulating substrate according to a further different embodiment of the invention.

FIG. 10 illustrates an example of the insulating substrate 10 which contains one chip for each type of chips in the power converter shown in FIGS. 1 through 7, corresponding to FIG. 2 in the embodiment 1. As illustrated in FIG. 12, the upper arm IGBT chip 1a, the upper arm diode chip 2a, the lower arm IGBT chip 3a, and the lower arm diode chip 4a are disposed one for each on the insulating substrate 10 in this embodiment. The gate electrode of the upper arm IGBT chip 1a is connected with the upper arm gate wiring pattern 14a, and the gate electrode of the lower arm IGBT chip 3a is connected with the lower arm gate wiring pattern 15a. The aluminum ribbon 72 is directly connected with the alternating current wiring pattern 12a. Other structures are similar to the corresponding structures shown in FIGS. 1 through 6, and provide similar effects. The structures in this embodiment can offer advantages similar to the advantages described above.

Embodiment 4

FIG. 12 illustrates the details of an enlarged part of a power converter according to this embodiment, corresponding to FIG. 3 in the embodiment 1. As illustrated in FIG. 13, the thermistor wiring pattern 18 disposed near the upper end of the insulating substrate 10 functions as a negative electrode high voltage wiring pattern, and the thermistor wiring pattern 19 functions as a positive electrode high voltage wiring pattern in this embodiment. A negative electrode high voltage wiring bus bar 33a is provided on the terminal stand 30, while a negative electrode high voltage pattern 49− and a positive electrode high voltage pattern 49+ are provided on the printed-wiring board 40.

The negative electrode high voltage wiring pattern and the positive electrode high voltage wiring pattern are positioned on the side of the wiring to which the highest potential is applied in the power module side wirings discussed above (hereinafter referred to as the highest potential wiring), i.e., on the side of the positive electrode wiring pattern 11 in this embodiment, corresponding to the side opposite to the side where other patterns to which lower potential than the potential for the positive electrode wiring pattern 11 is applied are disposed.

The negative electrode high voltage wiring pattern is connected with the negative electrode high voltage wiring bus bar 33a via an aluminum wire 28, and connected with the negative electrode high voltage pattern 49− via the aluminum wire 71. The positive electrode high voltage wiring pattern is connected with the positive electrode wiring pattern 11 via an aluminum wire 29, and connected with the positive electrode high voltage pattern 49+ via the aluminum wire 71.

The negative electrode high voltage wiring bus bar 33a is constituted by the same metal plate as that of the negative electrode bus bar 33, and held by insulating material such as resin. Other components in FIG. 13 are similar to the corresponding components shown in FIGS. 1 through 7. According to this structure, direct current voltages applied to the positive electrode bus bar 32 and the negative electrode bus bar 33 on the terminal stand 30 can be extracted using a current channel Ihv shown in FIG. 13 via the insulating substrate 10 and the printed board 40. In other words, the negative electrode high voltage wiring pattern functions as a lowest potential extracting wiring, while the positive electrode high voltage wiring pattern functions as a highest potential extracting wiring. The currents flowing in the channel Ihv constantly pass adjacent to each other. The IGBT chips 1a, 1b, 3a, and 3b and the diodes 2a, 2b, 4a, and 4b do not cross each other. According to this structure, the inductance in the current channel Ihv at direct current voltage is low, and the effect of the voltage surge generated by switching is small.

Another example using the structure shown in FIG. 13 is further explained. When the structure shown in FIG. 13 is applied to the area U in FIG. 1, the current channel Ihv is disposed along the upper end of the printed board 40 and connected with the gate pin 70. According to this structure, currents flowing in the current channel Ihv constantly pass adjacent to each other without crossing the power source circuit 51, the driver circuit 52, and the switching circuit 53 on the printed board 40. Thus, the inductance is low, and the effect of the voltage surge generated by switching is small.

When thermistors are attached to the structure shown in FIG. 13 in place of the aluminum wires 28 and 29, the structure shown in FIG. 3 is produced. In this case, the insulating substrates 10a, 10b, and 10c can be used as common components even in the case of the example shown in FIG. 1 which includes the structure shown in FIG. 13 for the area U and a structure different from the structure shown in FIG. 3 for each of the areas V and W. Thus, reduction of the cost can be achieved. Therefore, a low-noise and high noise resistant power converter can be provided at low cost according to the invention.

As discussed above, signals flowing in the gate pin 70 in FIG. 9 become only weak current signals, and achieve reduction of the size and cost. According to the structure shown in FIG. 13, however, direct current voltage is applied to the gate pin 70. In this case, the current channel Ihv at direct current voltage is similarly located near the end of the gate pin 70 as illustrated in FIG. 13. Thus, the insulation distance between the two pins at direct current voltage and the distance between other pins and the two pins are only required to be increased, which similarly achieves reduction of the size and cost.

The two pins at direct current voltage of the control board 83 shown in FIG. 13 are separated from other pins. In this case, the block to which high voltage is applied such as a voltage detection block at high voltage can be easily separated from a control block which outputs PWM and others without crossing of the respective signal lines within the board. Accordingly, the control board 83 becomes a low-noise and high noise-resistant control board. Moreover, the necessity for introducing direct current voltage into the control board 83 using other means such as a high voltage harness is eliminated. This elimination of the high voltage harness reduces the cost.

Embodiment 5

Figure 14:
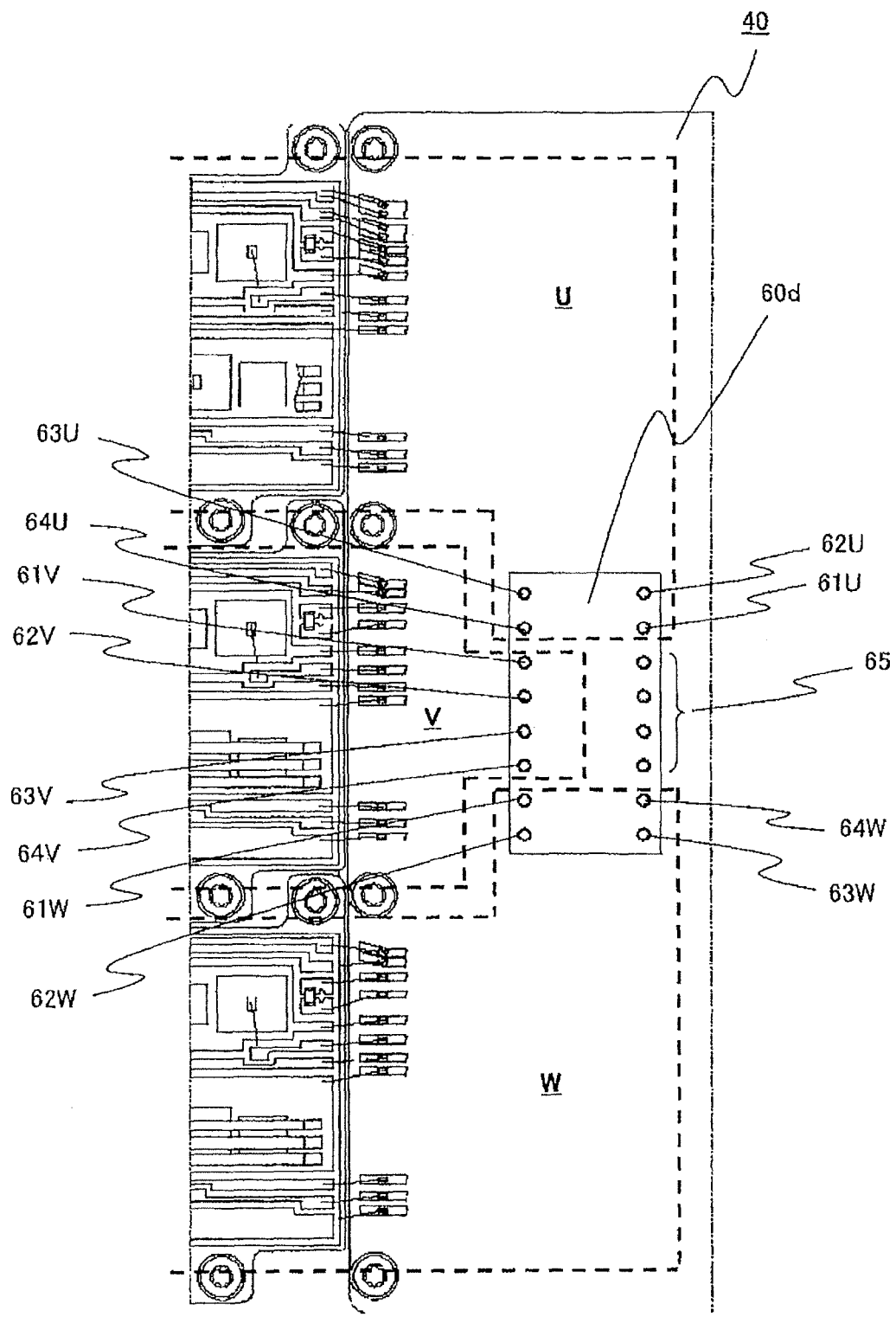
FIG. 14 illustrates the details of an enlarged part of an insulating substrate and a printed-wiring board according to a still further different embodiment of the invention.

FIG. 14 illustrates a part of the insulating substrate 10 and the printed-wiring board 40 of a power converter in this embodiment. As illustrated in FIG. 14, a power source transformer 60d in this embodiment has the upper arm secondary coil 66 and the lower arm secondary coil 67 discussed in FIG. 5 for each of the areas U, V, and W. This structure produces the power source circuit 51 for each of the areas U, V, and W.

Terminals of the power source transformer 60d are disposed in the order of an upper arm power source+terminal 61U, an upper arm power source−terminal 62U, a lower arm power source+terminal 63U, and a lower arm power source−terminal 64U for the area U, an upper arm power source+terminal 61V, an upper arm power source−terminal 62V, a lower arm power source+terminal 63V, and a lower arm power source−terminal 64V for the area V, and an upper arm power source+terminal 61W, an upper arm power source−terminal 62W, a lower arm power source+terminal 63W, and a lower arm power source−terminal 64W for the area W in the anticlockwise direction in the figure along the outer periphery of the electric transformer 60d.

The power source circuit 51 and the driver circuit 52 are provided for each of the areas U, V, and W. The switching circuit 53 is disposed around the low voltage terminals 65 without crossing the areas U, V, and W. According to this structure, only one unit of the power source transformer 60d is required, which contributes to reduction of the size and the cost. In the case of the example shown in FIG. 14, the thermistor wiring crosses the areas U, V, and W when the thermistor wiring passes below the power source transformer 60d, for example. However, other structures are similar to the corresponding structures shown in FIGS. 1 through 6, and provide similar effects.

Embodiment 6

Figure 15:
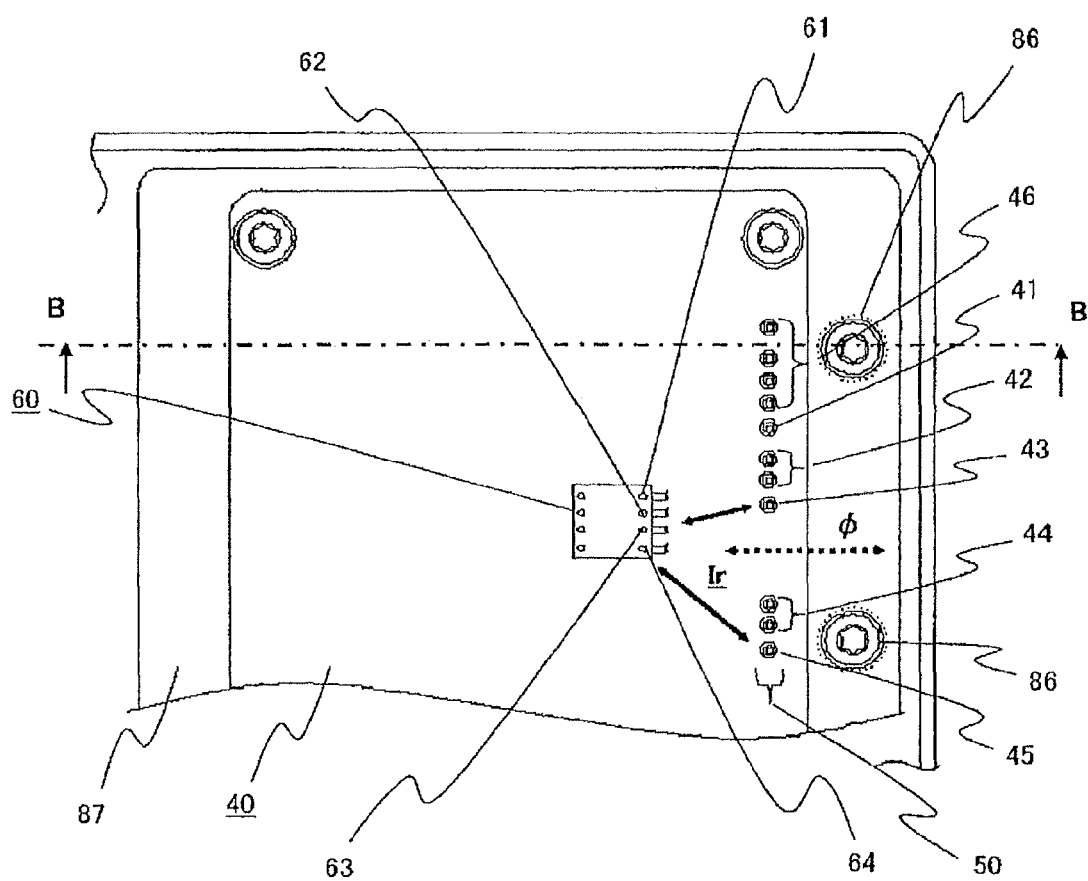
FIG. 15 illustrates the details of an enlarged part of an insulating substrate and a printed-wiring board according to a still further different embodiment of the invention.
Figure 16:
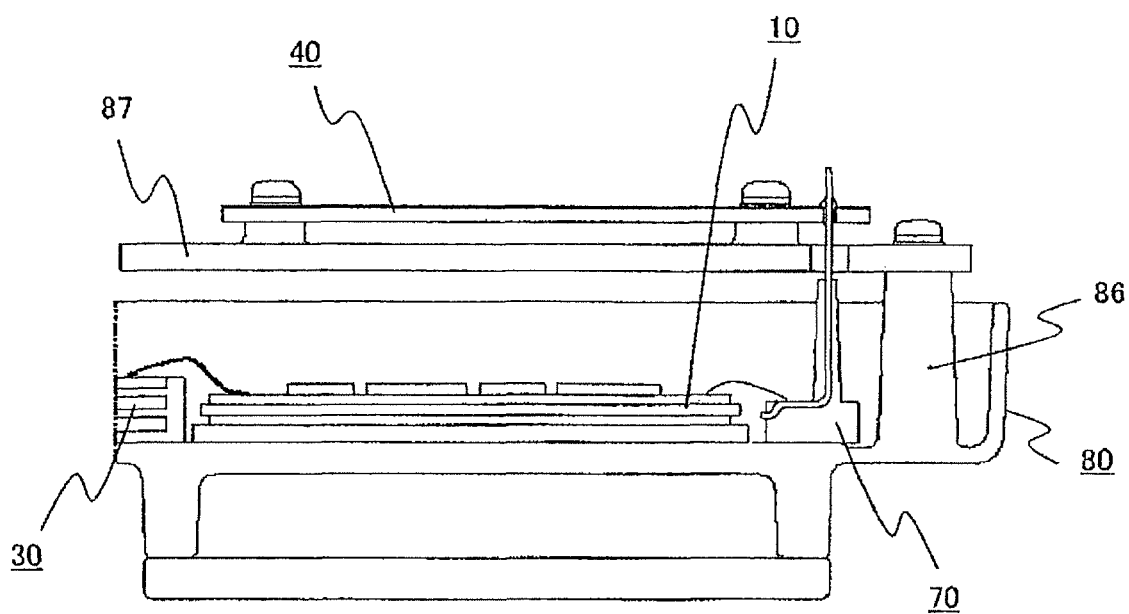
FIG. 16 is a cross-sectional view of the insulating substrate and the printed-wiring board according to the still further different embodiment of the invention.

FIG. 15 illustrates the details of an enlarged part of a power converter according to this embodiment. FIG. 16 is a cross-sectional view taken along a line B-B in FIG. 15. According to this embodiment, the driver module and the power module are disposed such that the surface on which the driver module side wirings discussed above are provided and the surface on which the power module side wirings discussed above are provided are disposed substantially in parallel with each other and overlapped with each other as illustrated in FIG. 16. The printed board 40 in this embodiment is fixed via screws or the like to a board plate 87 formed from a conductor such as an aluminum die casting, and mounted on the board plate 87. The board plate 87 is fixed to a plate support pole 86 by screws or the like to be electrically connected with the plate support pole 86. The plate support pole 86 electrically connected with the frame 80 as a conductor is formed from an aluminum die casting or the like and formed integrally with the frame 80.

The printed board 40 is connected with the insulating substrate 10 via the gate pin 70. The insulating substrate 10 is connected with the gate pin 70 via an aluminum wire or the like. The terminals 50 constituted by lands or the like are provided near one side of the printed board 40, and connected with the gate pin 70 by solder or the like. The terminals 50 are electrically connected with the wiring patterns on the printed board 40. The wiring patterns and the terminals 50 are disposed in the order of the thermistor pattern 46, the positive electrode pattern 41, the upper arm gate pattern 42, the alternating current pattern 43, the lower arm gate pattern 44, and the negative electrode pattern 45 from the upper side.

The power source transformer 60 is mounted on the printed board 40. Terminals of the power source transformer 60 are disposed in the order of the upper arm power source+terminal 61, the upper arm power source−terminal 62, the lower arm+ power source terminal 63, the lower arm−power source terminal 64 from the upper side. The insulating substrate 10 is structured similarly to the insulating substrate 10 in FIG. 2. According to the structure explained herein, leakage current generated by switching surge flows substantially along the current channel Ir shown in FIG. 15 on the printed board 40, and becomes a loop current crossing over the gate pin 70 and the insulating substrate 10. This loop current produces orthogonal magnetic flux $\phi$.

The plate support pole 86 discussed above is disposed at a position crossing the orthogonal magnetic flux $\phi$, i.e., in the vicinity of the thermistor pattern 46 and in the vicinity of the negative electrode pattern 45, for example, and electrically connected with the board plate 87 and the frame 80. In other words, the board plate 87, the plate support pole 86, and the frame 80 are similarly provided in this embodiment as electrically connected conductors in such positions as to surround magnetic flux generated by leakage current looping through the power source path transformer 60, the driver module side wirings, and the power module side wirings. In this case, eddy current looping through the plate support pole 86, the board plate 87, and the frame 80 is produced by the orthogonal magnetic flux $\phi$, and decreases the inductance in the leakage current channel Ir. Other structures are similar to the corresponding structures shown in FIGS. 1 through 6, and provide similar effects.

Embodiment 7

Figure 17:
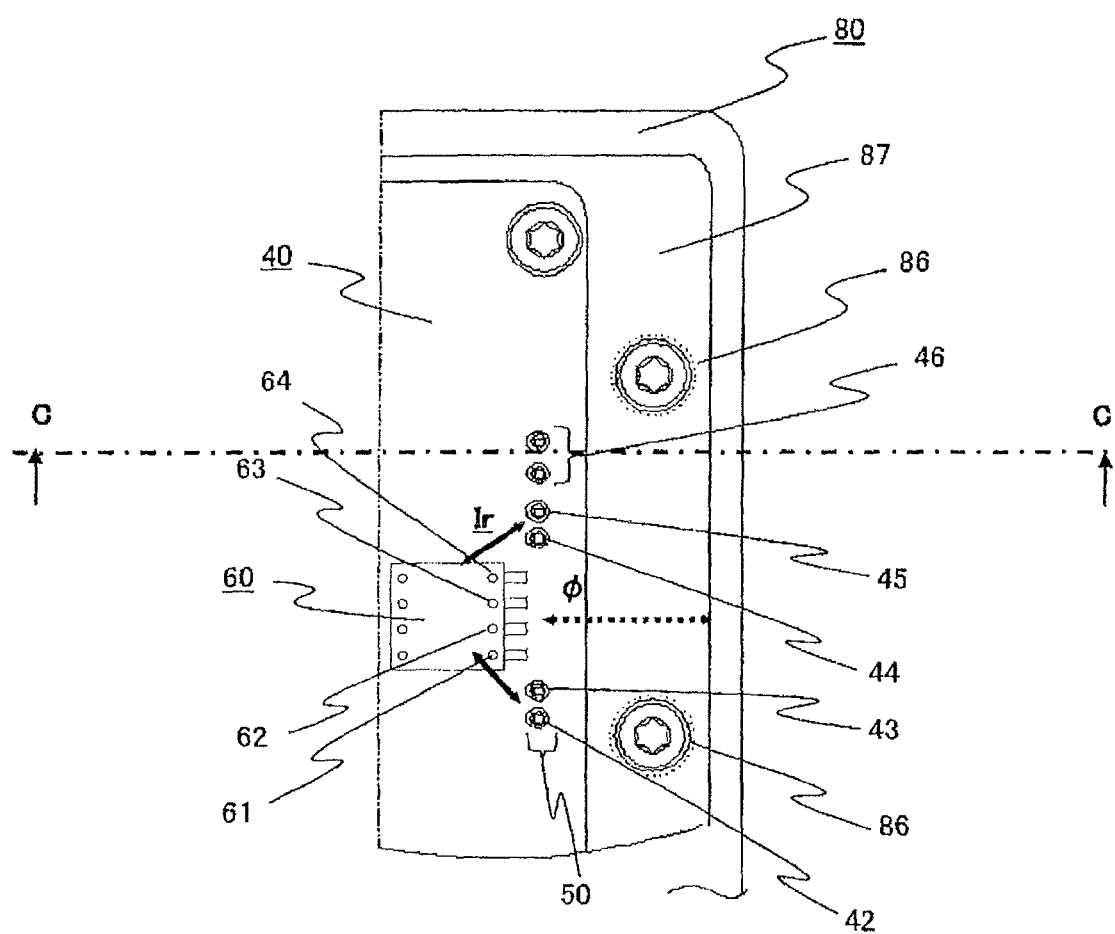
FIG. 17 illustrates the details of an enlarged part of an insulating substrate and a printed-wiring board according to a still further different embodiment of the invention.
Figure 18:
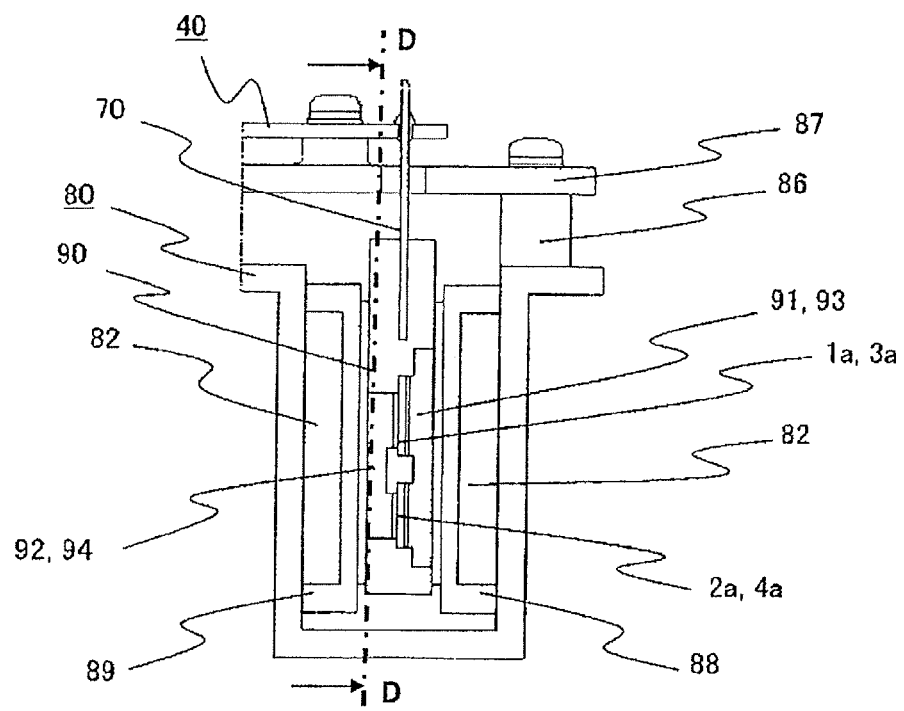
FIG. 18 is a cross-sectional view of the insulating substrate and the printed-wiring board according to the still further different embodiment of the invention.
Figure 19:
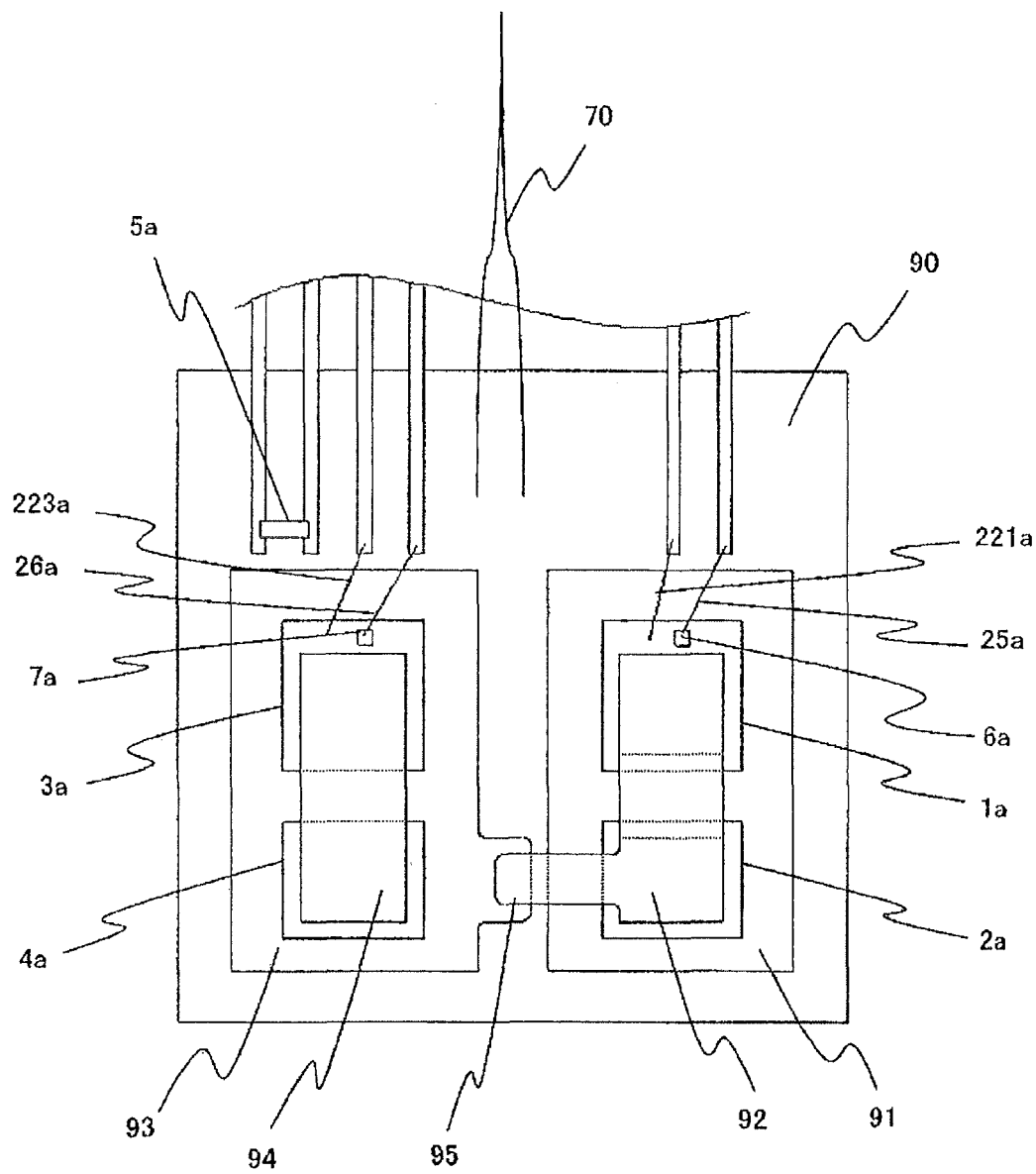
FIG. 19 is a cross-sectional view of the insulating substrate and the printed-wiring board according to the still further different embodiment of the invention.

FIG. 17 illustrates the details of an enlarged part of a power converter according to this embodiment. FIG. 18 is a cross-sectional view taken along a line C-C in FIG. 17. FIG. 19 is a perspective view illustrating a cross section taken along a line D-D in FIG. 18. The power converter in this embodiment has an insulating mold 90 on which the chips are mounted in place of the insulating substrate 10, and the structure provided on the mold 90 functions as a power module. According to this embodiment, the driver module and the power module are disposed such that the surface on which the driver module side wirings discussed above are provided and the surface on which the power module side wirings discussed above are provided cross each other substantially at right angles as illustrated in FIG. 18. In the condition shown in FIG. 19, an emitter electrode and the upper arm gate electrode 6*a* are provided on the upper surface of the upper arm IGBT chip 1*a*, while a collector electrode is equipped on the lower surface of the upper arm IGBT chip 1*a*. On the other hand, an anode electrode is provided on the upper surface of the upper arm diode chip 2*a*, while the cathode electrode is equipped on the lower surface of the upper arm diode chip 2*a*.

Each of the lower arm IGBT chip 3*a* and the lower arm diode chip 4*a* has similar terminals. The lower surfaces of the upper arm IGBT chip 1*a* and the upper arm diode chip 2*a* are brazed to a positive electrode lead 91 by solder or the like, while the emitter electrode on the upper surface of the upper arm IGBT chip 1*a* and the cathode electrode on the upper arm diode chip 2*a* are connected with a first alternating current lead 92 by solder or the like. The upper arm gate electrode 6*a* is connected with the gate pin 70 via the aluminum wire 25*a* to be connected with the printed-wiring board 40 via the gate pin 70.

The lower surfaces of the lower arm IGBT chip 3*a* and the lower arm diode chip 4*a* are brazed to a second alternating current lead 93 by solder or the like, while the emitter electrode on the upper surface of the lower arm IGBT chip 3*a* and the cathode electrode on the lower arm diode chip 4*a* are connected with a negative electrode lead 94 similarly by solder or the like. The lower arm gate electrode 7*a* is connected with the gate pin 70 via the aluminum wire 26*a* to be connected with the printed-wiring board 40 via the gate pin 70.

The emitter electrode on the upper arm IGBT chip 1*a* is further connected with the gate pin 70 via the aluminum wire 221*a*, while the emitter electrode on the lower arm IGBT chip 3*a* is connected with the gate pin 70 via the aluminum wire 223*a*. These connections, that is, the connections between the gate pin 70 and the aluminum wires 221*a* and 223*a* have functions similar to the functions of the upper gate return wiring pattern 212 and the lower gate return wiring pattern 213 explained in FIGS. 10 and 11.

The thermistor 5*a* is connected between the pins of the gate pin 70 by solder or the like to measure the temperature increase of the respective leads 91 through 94 resulting from generation of heat from the upper arm IGBT chip 1*a*, the upper arm diode chip 2*a*, the lower arm IGBT chip 3*a*, and the lower arm diode chip 4*a*. According to this structure, measurement signals from the thermistor 5*a* are transmitted via the gate pin 70 to the upper controller such as the control board 83 discussed in FIG. 9.

The first alternating current lead 92 and the second alternating current lead 93 are joined to each other by a lead junction 95 using solder or the like. The respective leads 91 through 94, the aluminum wires 25*a*, 26*a*, 221*a*, and 223*a*, the thermistor 5*a*, and a part of the lead 70 are sealed by the resin insulating mold 90 such as a transfer mold.

In FIG. 17, the respective leads 91 through 94, and the mold 90 are sandwiched between a first substrate 88 and a second substrate 89 via an insulating sheet. The first substrate 88 and the second substrate 89 are made of conductive materials such as aluminum and aluminum alloy, and formed by forging press or other methods. Spaces are produced between the frame 80 and the surfaces of the first substrate 88 and the second substrate 89 on the side opposite to the side holding the respective leads 91 through 94 and the mold 90. These spaces function as the cooling water channel 82. The first substrate 88 and the second substrate 89 are electrically connected with the frame 80.

The printed-wiring board 40 is fixed via screws or the like to the board plate 87 formed from a conductive material such as an aluminum die casting to be mounted on the board plate 87. The board plate 87 is fixed to the plate support pole 86 by screws or the like to be electrically connected to the plate support pole 86. The plate support pole 86 is electrically connected with the frame 80. The plate support pole 86 is formed from an aluminum die casting or the like and formed integrally with the frame 80. The printed-wiring board 40 has the terminals 50 constituted by lands or the like on the one side thereof. The terminals 50 are provided near one side of the printed-wiring board 40, and connected with the gate pin 70 by solder or the like.

The terminals 50 are electrically connected with the wiring patterns on the printed-wiring board 40. The wiring patterns and the terminals 50 are disposed in the order of the upper arm gate pattern 42, the alternating current pattern 43, the lower arm gate pattern 44, the negative electrode pattern 45, and the thermistor pattern 46 from the lower side in FIG. 17. The power source transformer 60 is mounted on the printed-wiring board 40. The terminals on the power source transformer 60 are disposed in the order of the upper arm power source+ terminal 61, the upper arm power source−terminal 62, the lower arm+power source terminal 63, and the lower arm− power source terminal 64 from the lower side in FIG. 17.

According to the structure shown in FIGS. 17 through 19, leakage current generated by switching surge flows substantially along the leakage current channel Ir shown in the figure on the printed-wiring board 40. For example, when leakage current is generated between the alternating current pattern 43 and the negative electrode pattern 45 having minus potentials on the upper arm and the lower arm, the leakage current becomes a loop current crossing over the gate pin 70, the negative electrode lead 94, the lower arm IGBT chip 3a or the lower arm diode chip 4a, the second alternating current lead 93, and the first alternating current lead 92. This loop current produces the orthogonal magnetic flux $\phi$.

As illustrated in FIG. 17, the plate support pole 86 discussed above is disposed in the vicinity of the thermistor pattern 46 and in the vicinity of the upper arm gate pattern 42 in such a manner as to cross over the orthogonal magnetic flux $\phi$. The plate support pole 86 is electrically connected with the board plate 87, the frame 80, the first substrate 88, and the second substrate 89 as explained above. According to this embodiment, the board plate 87, the plate support pole 86, the frame 80, the first substrate 88, and the second substrate 89 are similarly disposed as electrically connected conductors in such positions as to surround magnetic flux generated by leakage current looping through the power source path transformer 60, the driver module side wirings, and the power module side wirings. In this case, eddy current looping through the board plate 87, the frame 80, the first substrate 88, and the second substrate 89 via the plate support pole 86 is produced, and this eddy current decreases the inductance in the leakage current channel Ir. Other structures are similar to the corresponding structures shown in FIGS. 1 through 6, and provide similar effects.

Embodiment 8

Figure 20:
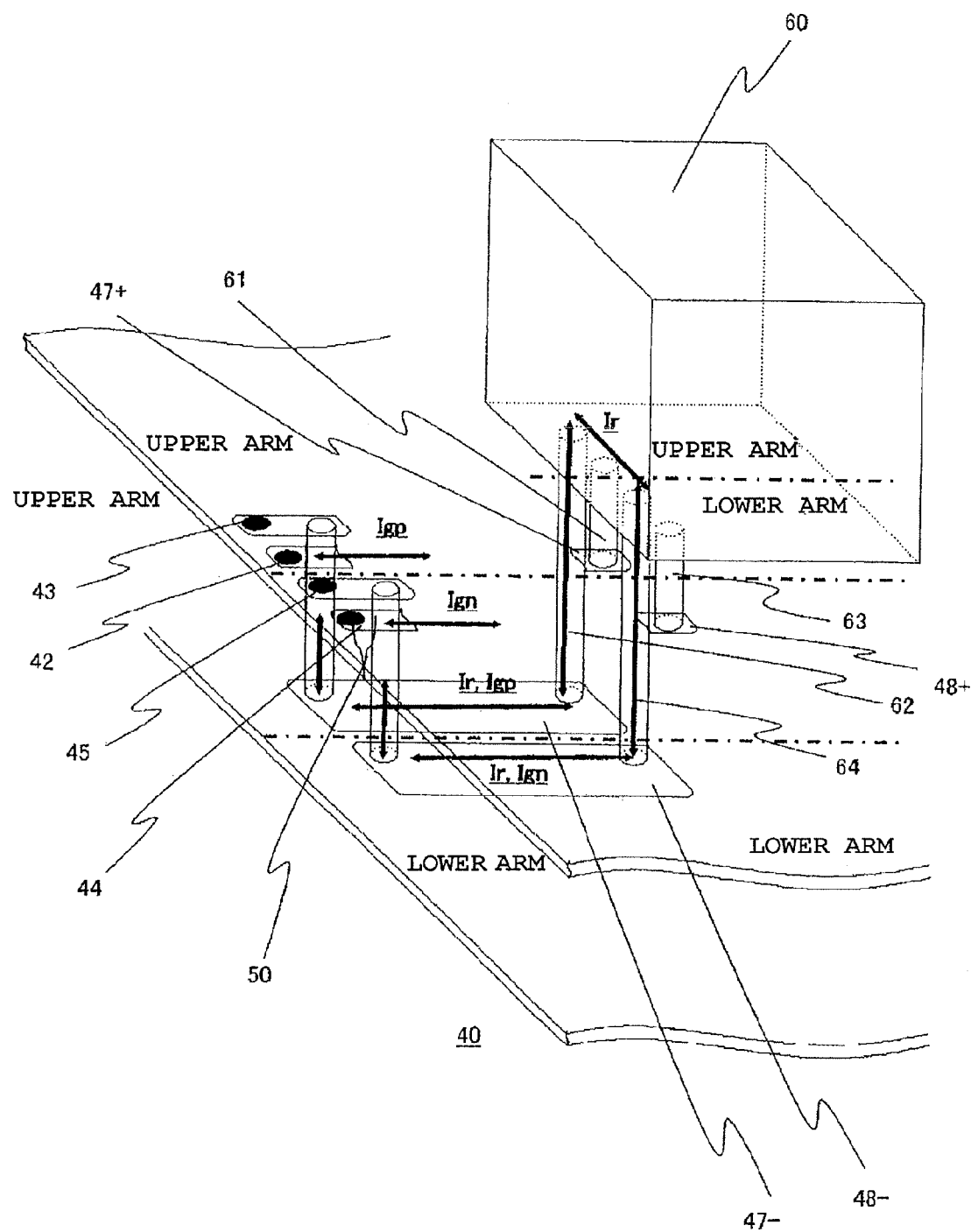
FIG. 20 is a perspective view of a printed-wiring board according to a still further different embodiment of the invention.

FIG. 20 illustrates the details of an enlarged part of the printed-wiring board 40 included in a power converter according to this embodiment. As illustrated in FIG. 20, the upper gate power source−pattern 47− and the lower gate power source−pattern 48− on the printed-wiring board 40 in this embodiment are disposed adjacent to each other, and positioned on a layer such as a second layer other than the top surface layer of the printed board 40. The terminals 50 are arranged near one side of the printed-wiring board 40. The connection portion between the terminals 50 and the upper arm gate pattern 42, the alternating current pattern 43, the lower arm gate pattern 44, and the negative electrode pattern 45 is disposed on the top surface layer of the printed board 40.

The upper arm power source−terminal 62 and the lower arm power source−terminal 64 on the power source transformer 60 are connected with the upper gate power source− pattern 47− and the lower gate power source−pattern 48−, respectively, on the second layer. The upper arm power source+terminal 61 and the lower arm power source+terminal 63 are connected with the upper gate power source−pattern 47+ and the lower gate power source−pattern 48+, respectively, on an arbitrary layer such as the top surface layer. The upper gate power source−pattern 47− is connected in the area overlapping with the alternating current pattern 43, while the lower gate power source−pattern 48− is connected in the area overlapping with the negative electrode pattern 45.

As illustrated in FIG. 20, the terminals 50 and the wiring patterns connecting with the terminals 50 are disposed in the order of the alternating current pattern 43, the upper arm gate pattern 42, the negative electrode pattern 45, and the lower arm gate pattern 44 in positions adjacent to each other. Similarly, the terminals of the power source transformer 60 are disposed in the order of the upper arm power source−terminal 62, the upper arm power source+terminal 61, the lower arm power source−terminal 64, and the lower arm power source+ terminal 63 in positions adjacent to each other.

According to this embodiment, the respective terminals of the power source transformer 60 and the wiring patterns 42 through 45, 47+, 47−, 48+, and 48− are disposed in such positions as to be sectioned substantially into the upper arm side and the lower arm side as viewed from the top surface side of the printed-wiring board 40. In other words, current flowing through the upper arm gate pattern 42 and the lower arm gate pattern 44 connected with the upper arm gate wiring patterns 14a and 14b, and the lower arm gate wiring patterns 15a and 15b, respectively, and current flowing through the alternating current pattern 43 and the negative electrode pattern 45 connected with the alternating current wiring pattern 12a and the negative electrode wiring pattern 13, respectively, reach the power source transformer 60 via different layers of the printed-wiring board 40.

According to this structure, leakage currents generated by switching surge pass through the leakage current channel Ir in the figure, and flow adjacent to each other within the printed-wiring board 40. In this case, the inductance in the leakage current channel Ir decreases. On the other hand, the gate currents pass through the gate current channels Igp and Ign in the figure, and flow adjacent to each other on the top surface layer and the second layer of the printed-wiring board 40. In this case, the inductances in the leakage current channels Igp and Ign decrease. Other structures are similar to the corresponding structures shown in FIGS. 1 through 6, and provide similar effects.

While various embodiments and modifications have been discussed herein, the invention is not limited to these specific examples. Other possible modes in light of the teachings within the technical ideas of the invention are included in the scope of the invention.

The disclosure of the following application to which this application claims priority is incorporated by reference herein.

Japanese Patent Application No. 2010-066272 (filed Mar. 23, 2010)

The invention claimed is:

1. A power converter which includes a power module allowing supply and cutoff of main current, and a driver module controlling supply and cutoff of the main current allowed by the power module, comprising:

a high potential side semiconductor device which allows supply and cutoff of the main current on the high potential side of the power module;

a low potential side semiconductor device which allows supply and cutoff of the main current on the low potential side of the power module, and is connected with the high potential side semiconductor device in series;

plural power module side wirings connected with respective electrodes contained in the high potential side semiconductor device and the low potential side semiconductor device, and disposed adjacent to each other substantially on the same plane as the power module in the order of applied potentials with a connection end between the plural power module side wirings and the driver module located along the end of the power module;

plural driver module side wirings provided on the driver module as wirings connected with the plural corresponding power module side wirings, and disposed, adjacent to each other substantially on the same plane as the driver module in the order corresponding to the positions of the plural power module side wirings in positions along the end of the driver module;

a power source transformer as a circuit provided on the driver module to convert a signal voltage for controlling the supply and cutoff of the main current into voltage applied to a control electrode of the high potential side semiconductor device and a control electrode of the low potential side semiconductor device, plural terminals of the power source transformer in correspondence with the plural driver module side wirings being provided in the order of the positions of the plural corresponding driver module side wirings; and conductors disposed in the vicinity of the plane on which the plural power module side wirings are provided and in the vicinity of the plane on which the plural driver module side wirings are provided, and electrically connected in such positions as to surround magnetic flux generated by current looping at least through the power source transformer, the driver module side wirings, and the power module side wirings.

2. The power converter according to claim 1, wherein the plural power module side wirings are disposed substantially on the same plane as the power module in such positions that current in one wiring of the power module side wirings flows in a direction opposed to the flow direction of current in another wiring of the power module side wirings disposed adjacent to the one wiring.

3. The power converter according to claim 1, wherein an input terminal through which the main current is inputted to the power module and an output terminal through which the main current is outputted from the power module are disposed at the end of the power module on the side opposite to the side where the connection end between the power module and the driver module is positioned.

4. The power converter according to claim 3, wherein:

there are provided on the plane where the plural power module side wirings are disposed, a highest potential extracting wiring as a side of the highest potential wiring to which the highest potential is applied in the plural power module side wirings, disposed in an area on the side opposite to the side where the lowest potential wiring to which the lowest potential is applied in the plural power module side wirings is disposed, and electrically connected with the highest potential wiring, with a connection end between the highest voltage extracting wiring and the driver module disposed at the end of the power module on the side where the connection end between the plural power module side wirings and the driver module is positioned, and a lowest potential extracting wiring disposed adjacent to the highest potential extracting wiring in the area on the opposite side in such a position that current flows in a direction opposed to the highest potential extracting wiring, and electrically connected with the lowest potential wiring, with a connection end between the lowest potential extracting wiring and the driver module disposed at the end of the power module on the side where the connection end between the plural power module side wirings and the driver module is positioned; and the plural driver module side wirings contain wirings connected with the highest potential extracting wiring and the lowest potential extracting wiring, and are disposed in correspondence with the highest potential extracting wiring and the lowest potential extracting wiring as well.

5. The power converter according to claim 1, wherein a high potential side gate wiring contained in the plural power module side wirings and connected with a gate electrode of the high potential side semiconductor device, and a high potential side emitter wiring connected with an emitter electrode of the high potential side semiconductor device and the corresponding wiring of the plural driver module side wirings are disposed adjacent to each other in such positions that flow directions of currents flowing in the high potential side gate wiring and the high potential side emitter wiring are opposed to each other.

6. The power converter according to claim 5, wherein the emitter electrode of the high potential side semiconductor device is connected in parallel with a low potential side collector wiring connected with the high potential side emitter wiring and a collector electrode of the low potential side semiconductor device.

7. The power converter according to claim 1, wherein a low potential side gate wiring contained in the plural power module side wirings and connected with a gate electrode of the low potential side semiconductor device, and a low potential side emitter wiring connected with an emitter electrode of the low potential side semiconductor device and the corresponding wiring of the plural driver module side wirings are disposed adjacent to each other in such positions that flow directions of currents flowing in the low potential side gate wiring and the low potential side emitter wiring are opposed to each other.

8. The power converter according to claim 7, wherein the emitter electrode of the low potential side semiconductor device is connected in parallel with the low potential side emitter wiring and an output terminal wiring connected with an output terminal which outputs the main current from the power module.

9. The power converter according to claim 1, wherein:

the power module and the driver module are disposed adjacent to each other such that the plane on which the plural power module side wirings are provided and the plane on which the plural driver module side wirings are provided become substantially parallel with each other; and the conductors are disposed as integrated conductors in the vicinity of the plane on which the plural power module side wirings are provided and in the vicinity of the plane on which the plural driver module side wirings are provided.

10. The power converter according to claim 1, wherein:

the power module and the driver module are disposed such that the plane on which the plural power module side wirings are provided and the plane on which the plural driver module side wirings are provided become parallel with each other and overlap with each other; and a first conductor disposed in the vicinity of the plane on which the plural power module side wirings are provided and a second conductor disposed in the vicinity of the plane on which the plural driver module side wirings are provided are electrically connected with each other by a fixing member which fixes at least either the first conductor or the second conductor.

11. The power converter according to claim 1, wherein:
the power module and the driver module are disposed such that the plane on which the plural power module side wirings are provided and the plane on which the plural driver module side wirings are provided cross each other substantially at right angles; and a first conductor disposed in the vicinity of the plane on which the plural power module side wirings are provided and a second conductor disposed in the vicinity of the plane on which the plural driver module side wirings are provided are electrically connected with each other by a fixing member which fixes at least either the first conductor or the second conductor.

12. The power converter according to claim 1, wherein:
the driver module has a multilayer wiring substrate; and
current flowing in the driver module side wirings connected with the power module side wirings connected with the gate electrodes of the high potential side semiconductor device and the low potential side semiconductor device, and current flowing in the driver module side wirings connected with the power module side wirings connected with the emitter electrodes of the high potential side semiconductor device and the low potential side semiconductor device pass through different layers in the driver module to reach the power source transformer.

* * * * *